(12) United States Patent
Chen et al.

(10) Patent No.: US 12,057,437 B2
(45) Date of Patent: Aug. 6, 2024

(54) PACKAGE STRUCTURE, CHIP STRUCTURE AND METHOD OF FABRICATING THE SAME

(71) Applicant: Taiwan Semiconductor Manufacturing Company, Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 484 days.

(21) Appl. No.: 17/338,660

(22) Filed: Jun. 3, 2021

(65) Prior Publication Data

US 2021/0296288 A1    Sep. 23, 2021

Related U.S. Application Data

(63) Continuation of application No. 16/515,012, filed on Jul. 17, 2019, now Pat. No. 11,063,019.

(51) Int. Cl.
*H01L 25/065* (2023.01)
*H01L 21/56* (2006.01)
(Continued)

(52) U.S. Cl.
CPC ...... *H01L 25/0657* (2013.01); *H01L 23/3128* (2013.01); *H01L 23/3185* (2013.01);
(Continued)

(58) Field of Classification Search
None
See application file for complete search history.

(56) References Cited

U.S. PATENT DOCUMENTS

| 6,765,299 B2 * | 7/2004 | Takahashi | H01L 23/3107 |
| | | | 257/688 |
| 7,084,513 B2 * | 8/2006 | Matsuki | H01L 23/5389 |
| | | | 257/E23.173 |

(Continued)

*Primary Examiner* — Evren Seven
(74) *Attorney, Agent, or Firm* — JCIPRNET

(57) ABSTRACT

A chip structure includes first and second semiconductor chips. The first semiconductor chip includes a first semiconductor substrate, a first interconnection layer located on the first semiconductor substrate, a first protection layer covering the first interconnection layer, a gap fill layer located on the first protection layer, and first conductive vias embedded in the gap fill layer and electrically connected with the first interconnection layer. The second semiconductor chip is embedded within the first semiconductor chip and surrounded by the gap fill layer and the first conductive vias, wherein the second semiconductor chip includes a second semiconductor substrate, a second interconnection layer located on the second semiconductor substrate, a second protection layer located on the second interconnection layer, and second conductive vias embedded in the second protection layer and electrically connected with the second interconnection layer, wherein the second semiconductor substrate is bonded to the first protection layer.

20 Claims, 28 Drawing Sheets

(51) Int. Cl.
  *H01L 23/00*   (2006.01)
  *H01L 23/29*   (2006.01)
  *H01L 23/31*   (2006.01)
  *H01L 23/522*  (2006.01)
  *H01L 23/528*  (2006.01)
  *H01L 23/538*  (2006.01)
  *H01L 25/00*   (2006.01)

(52) U.S. Cl.
  CPC ...... *H01L 23/3192* (2013.01); *H01L 23/5226* (2013.01); *H01L 23/5283* (2013.01); *H01L 23/5383* (2013.01); *H01L 23/5386* (2013.01); *H01L 23/5389* (2013.01); *H01L 25/0652* (2013.01); *H01L 25/50* (2013.01); *H01L 21/561* (2013.01); *H01L 23/291* (2013.01); *H01L 24/97* (2013.01)

(56) References Cited

U.S. PATENT DOCUMENTS

| | | | |
|---|---|---|---|
| 7,550,833 B2 * | 6/2009 | Mihara | H01L 23/5389 |
| | | | 257/E23.079 |
| 8,754,514 B2 * | 6/2014 | Yu | H01L 25/0657 |
| | | | 257/687 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,437,583 B1 * | 9/2016 | Shih | H01L 23/3157 |
| 9,443,783 B2 | 9/2016 | Lin et al. | |
| 9,460,987 B2 * | 10/2016 | Hung | H01L 23/528 |
| 9,496,189 B2 | 11/2016 | Yu et al. | |
| 9,786,599 B2 * | 10/2017 | Yu | H01L 21/568 |
| 9,831,224 B2 * | 11/2017 | Lin | H01L 24/19 |
| 10,431,549 B2 * | 10/2019 | Huang | H01L 21/6835 |
| 2007/0096292 A1 * | 5/2007 | Machida | H01L 21/4857 |
| | | | 257/E23.105 |
| 2008/0246126 A1 * | 10/2008 | Bowles | H01L 24/24 |
| | | | 257/659 |
| 2010/0133704 A1 * | 6/2010 | Marimuthu | H01L 23/3128 |
| | | | 257/E23.116 |
| 2011/0068427 A1 * | 3/2011 | Paek | H01L 24/20 |
| | | | 257/E21.705 |
| 2012/0211892 A1 * | 8/2012 | Kim | H01L 24/97 |
| | | | 257/774 |
| 2012/0273960 A1 * | 11/2012 | Park | H01L 23/49827 |
| | | | 257/774 |
| 2013/0270685 A1 * | 10/2013 | Yim | H01L 21/563 |
| | | | 257/686 |
| 2014/0042638 A1 * | 2/2014 | Liu | H01L 23/49827 |
| | | | 438/118 |
| 2014/0091471 A1 * | 4/2014 | Chen | H01L 21/6836 |
| | | | 257/770 |
| 2014/0252646 A1 * | 9/2014 | Hung | H01L 25/0657 |
| | | | 257/774 |
| 2015/0145142 A1 * | 5/2015 | Lin | H01L 23/481 |
| | | | 257/774 |
| 2015/0171050 A1 * | 6/2015 | Chen | H01L 27/1464 |
| | | | 257/784 |
| 2015/0228580 A1 * | 8/2015 | Chen | H01L 23/5389 |
| | | | 257/532 |
| 2015/0348940 A1 * | 12/2015 | Woychik | H01L 23/481 |
| | | | 257/774 |
| 2016/0056057 A1 * | 2/2016 | Yu | H01L 23/498 |
| | | | 257/774 |
| 2016/0071820 A1 * | 3/2016 | Yu | H01L 23/3107 |
| | | | 257/737 |
| 2016/0093572 A1 * | 3/2016 | Chen | H01L 23/5389 |
| | | | 438/126 |
| 2016/0197029 A1 * | 7/2016 | Tsai | H01L 25/0657 |
| | | | 257/774 |
| 2016/0322336 A1 * | 11/2016 | Tu | H01L 24/97 |
| 2016/0322337 A1 * | 11/2016 | Liang | H01L 24/19 |
| 2018/0047674 A1 * | 2/2018 | Tsai | H01L 24/19 |
| 2018/0061813 A1 * | 3/2018 | Hsieh | H01L 23/3114 |
| 2018/0122780 A1 * | 5/2018 | Chen | H01L 23/49811 |

* cited by examiner

PACKAGE STRUCTURE, CHIP STRUCTURE AND METHOD OF FABRICATING THE SAME

CROSS-REFERENCE TO RELATED APPLICATION

This application is a continuation application of U.S. application Ser. No. 16/515,012, filed on Jul. 17, 2019, now allowed. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. In addition, such packages may further be integrated to a semiconductor substrate or carrier after dicing. Therefore, the reliability of the electrical connection between conductive terminals and an internal component (e.g. a redistribution circuit structure) within each package becomes important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
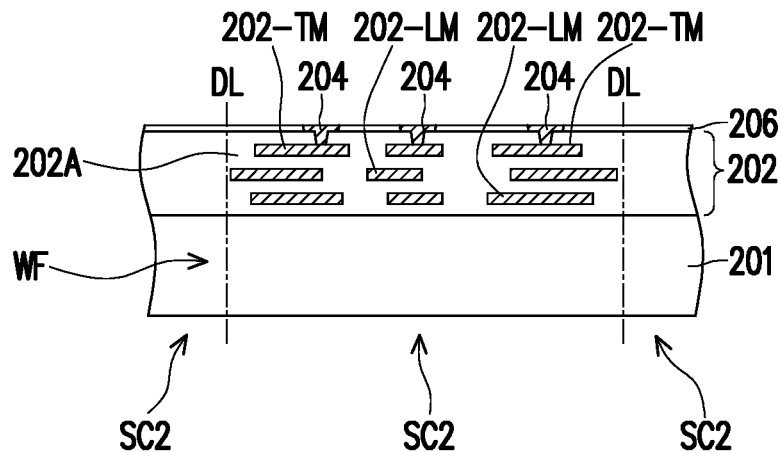
FIG. 1A to FIG. 1E are schematic sectional views of various stages in a method of fabricating a semiconductor chip according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic sectional views of various stages in a method of fabricating a semiconductor chip according to some exemplary embodiments of the present disclosure. In the exemplary embodiment, a method of fabricating a second semiconductor chip SC2 that is to be used in later embodiments is described. Referring to FIG. 1A a semiconductor wafer WF (second semiconductor wafer) having a plurality of second semiconductor chips SC2 (separated by dicing line DL) is provided. As illustrated in FIG. 1A, each of the second semiconductor chips SC2 includes a second semiconductor substrate 201, a second interconnection layer 202, a plurality of second conductive pads 204 and a dielectric layer 206. In the exemplary embodiment, the second semiconductor substrate 201 may be a bulk silicon substrate or a silicon-on-insulator (SOI) substrate, and further includes active components (e.g., transistors or the like) and optionally passive components (e.g., resistors, capacitors, inductors or the like) formed therein. The second interconnection layer 202 is disposed on the second semiconductor substrate 201 and may, for example, include a plurality of metallization layers (top metallization layer 202-TM and lower metallization layers 202-LM) and inter-dielectric layers 202A stacked alternately. The second conductive pads 204 may be aluminum pads, copper pads or other suitable metal pads. The second conductive pads 204 are for example, disposed on and electrically connected to the second interconnection layer 202 (e.g. connected to the top metallization layer 202-TM of the second interconnection layer 202). The dielectric layer 206 may be a silicon oxide layer, a silicon nitride layer, a silicon oxy-nitride layer or a dielectric layer formed of any suitable dielectric materials. In some embodiments, the dielectric layer 206 surrounds the second conductive pads 204 while exposing upper surfaces of the second conductive pads 204.

Figure 1B:
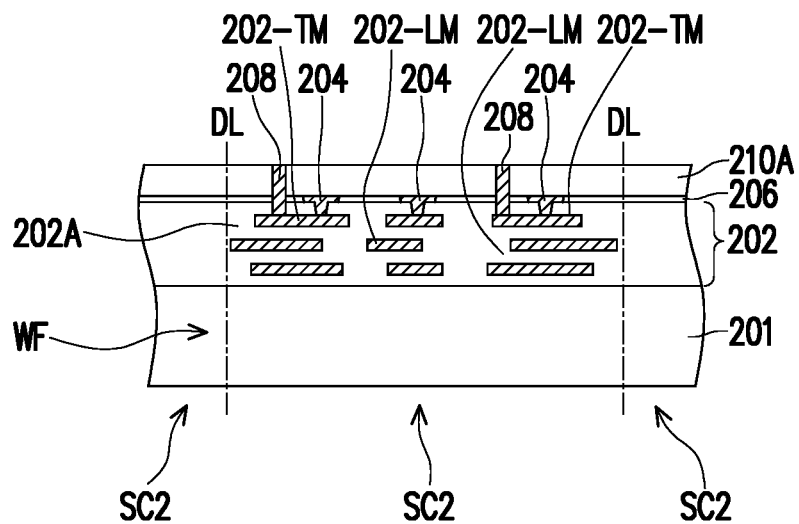

Referring to FIG. 1B, in a next step, a plurality of second conductive vias 208 is formed on the second interconnection layer 202, and a first protective portion 210A is formed to surround the plurality of second conductive vias 208. In some embodiments, the first protective portion 210A is formed on the second interconnection layer 202 first. Thereafter, the first protective portion 210A is patterned to form openings, whereby the second conductive vias 208 are formed within the opening to be electrically connected to the second interconnection layer 202. In some embodiments, the second conductive vias 208 is physically connected to the top metallization layer 202-TM of the second interconnection layer 202. In some embodiments, the second conductive vias 208 may be formed by plating. In certain embodiments, a planarization process (such as chemical mechanical polishing (CMP)) may be performed so that top surfaces of the second conductive vias 208 and the first protective portion 210A are coplanar with each other.

Figure 1C:
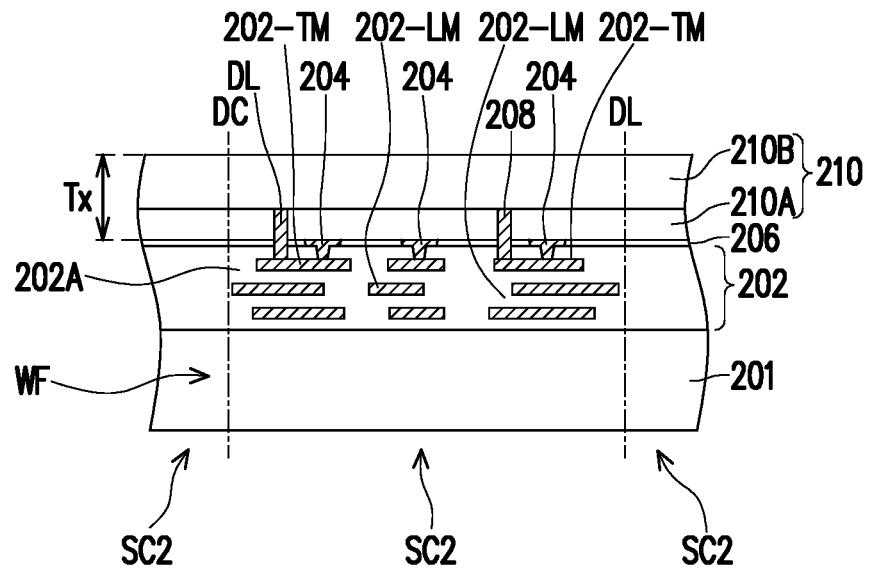

Referring to FIG. 1C, a second protective portion 210B is formed to cover the plurality of second conductive vias 208, and formed to cover the first protective portion 210A. In some embodiments, the first protective portion 210A and the second protective portion 210B constitute the second protection layer 210. In one exemplary embodiment, a total thickness Tx of the second protection layer 210 is around 20 μm, the disclosure is not limited thereto. In some embodiments, the first protective portion 210A and the second protective portion 210B may include materials such as polymers, dielectric materials, a resin material or the like. However, the disclosure is not limited thereto, and other suitable protective materials may be used. In certain embodiments, the first protective portion 210A and the second protective portion 210B (second protection layer 210) are oxide-based films.

Figure 1D:
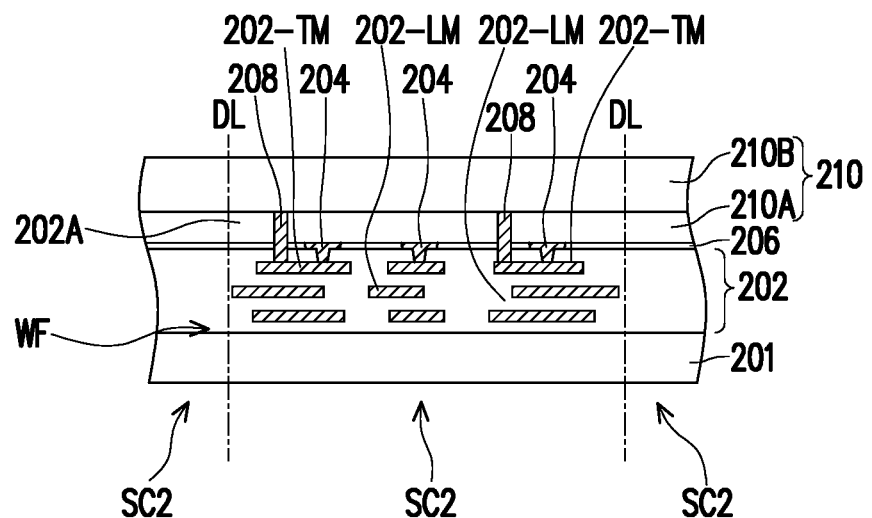

Referring to FIG. 1D, in a next step, a thinning process may be performed to thin down a backside of the second semiconductor substrate 201. For example, in one embodiment, the wafer structure may be turned upside down for thinning down the backside of the second semiconductor substrate 201. In some embodiments, the thinning process is performed so that a total height of the second semiconductor chip SC2 is reduced to around 40 μm. However, the disclosure is not limited thereto, and the height of the second semiconductor chip SC2 may be adjusted according to requirement.

Figure 1E:
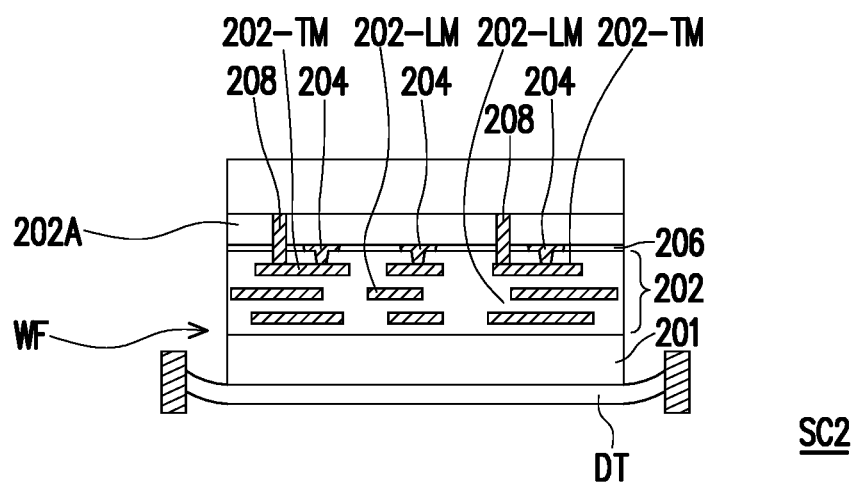

In some embodiments, referring to FIG. 1E, after thinning down the backside of the second semiconductor substrate 201 (semiconductor wafer WF), the semiconductor wafer WF may be diced along the dicing lines DL (shown in FIG. 1D) to separate the plurality of second semiconductor chip SC2 from one another. In certain embodiments, the semiconductor wafer WF is placed on a dicing tape DT used for die saw, so that the dicing can be performed on the dicing tape DT. Up to here, a second semiconductor chip SC2 of the exemplary embodiment may be fabricated.

Figure 2A:
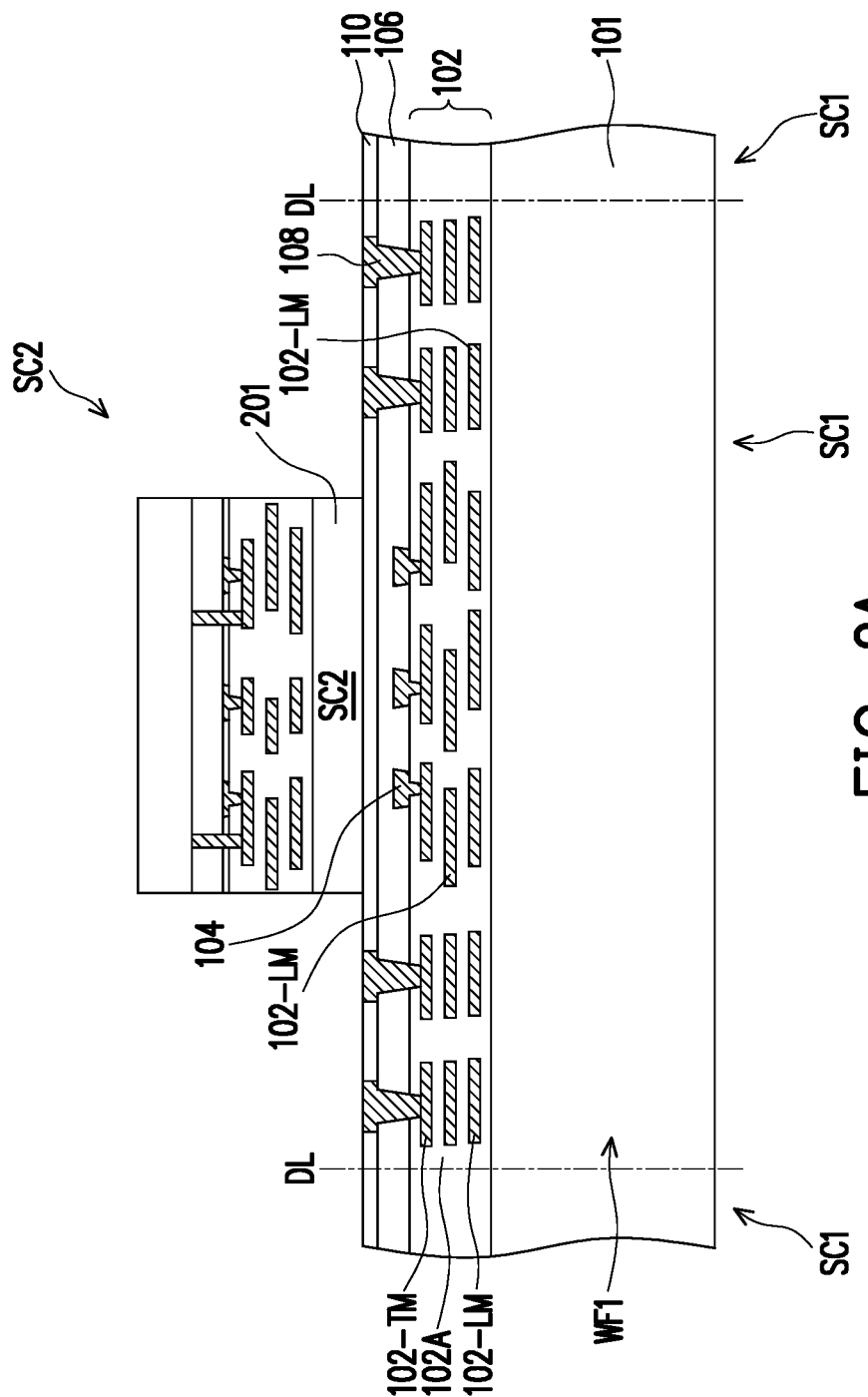
FIG. 2A to FIG. 2D are schematic sectional views of various stages in a method of fabricating a chip structure according to some exemplary embodiments of the present disclosure.

FIG. 2A to FIG. 2D are schematic sectional views of various stages in a method of fabricating a chip structure according to some exemplary embodiments of the present disclosure. Referring to FIG. 2A, a semiconductor wafer WF1 having a plurality of first semiconductor chips SC1 is provided. As illustrated in FIG. 2A, each of the first semiconductor chips SC1 includes a first semiconductor substrate 101, a first interconnection layer 102, a plurality of first conductive pads 104, a dielectric layer 106, a plurality of first conductive posts 108, and a first protection layer 110. In the exemplary embodiment, the first semiconductor substrate 101 may be a bulk silicon substrate or a silicon-on-insulator (SOI) substrate, and further includes active components (e.g., transistors or the like) and optionally passive components (e.g., resistors, capacitors, inductors or the like) formed therein. The first interconnection layer 102 is disposed on the first semiconductor substrate 101 and may, for example, include a plurality of metallization layers (top metallization layer 102-TM and lower metallization layers 102-LM) and inter-dielectric layers 102A stacked alternately. The first conductive pads 104 may be aluminum pads, copper pads or other suitable metal pads. The first conductive pads 104 are for example, electrically connected to the first interconnection layer 102. The first conductive posts 108 may be formed on the first interconnection layer 102 by plating. In some embodiments, the first conductive posts 108 are formed adjacent to the first conductive pads 104. The dielectric layer 106 may be a silicon oxide layer, a silicon nitride layer, a silicon oxy-nitride layer or a dielectric layer formed of any suitable dielectric materials. In some embodiments, the dielectric layer 106 may cover up the first conducive pads 104 while surrounding portions of the first conductive posts 108. In certain embodiments, the first protection layer 110 covers the dielectric layer 106 and the first interconnection layer 102, wherein upper surfaces of the first conductive posts 108 are exposed. The first protection layer 110 include materials such as polymers, dielectric materials, a resin material or the like. However, the disclosure is not limited thereto, and other suitable protective materials may be used. In certain embodiments, the protection layer 110 is an oxide-based film (e.g., silicon oxide film).

As illustrated in FIG. 2A, after providing the semiconductor wafer WF1, at least one second semiconductor chip SC2 prepared in FIG. 1E is disposed on the first protection layer 110 of the first semiconductor chips SC1. In some embodiments, the second semiconductor substrate 201 of the second semiconductor chip SC2 is in physical contact with the first protection layer 110 of the first semiconductor chip SC1. In certain embodiments, the semiconductor substrate 201 is directly bonded onto the first protection layer 110 by fusion bonding. For example, the fusion bonding may be oxide-oxide fusion bonding or silicon-oxide fusion bonding, the disclosure is not limited thereto. In case where the fusion bonding is oxide-oxide fusion bonding, an oxide-based film may be formed on the backside of the semiconductor substrate 201 for bonding to the first protection layer 110. The disclosure is not limited thereto.

Figure 2B:
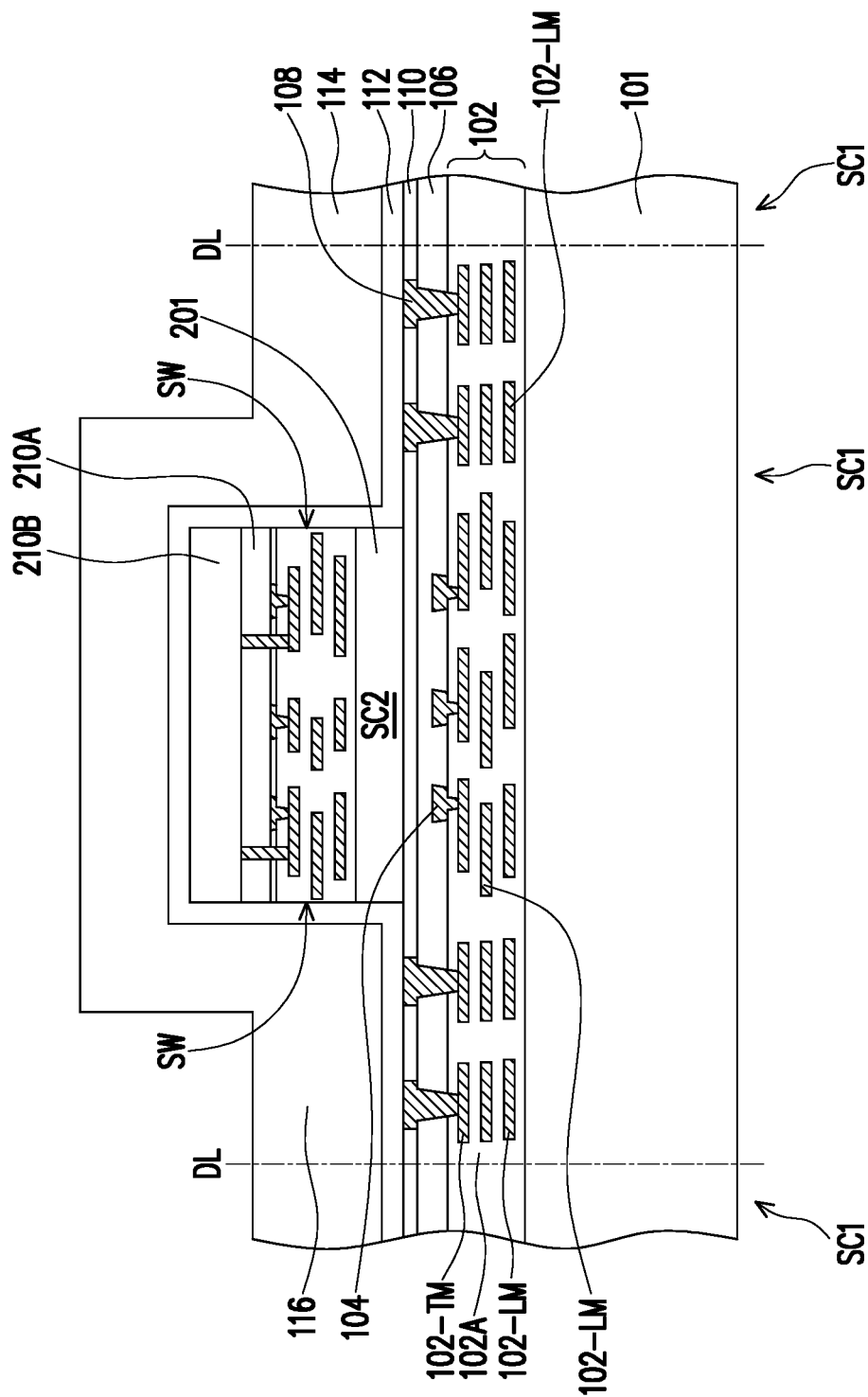

Referring to FIG. 2B, in a next step, a first etch stop layer 112 may be conformally formed over the first protection layer 110 and over the second semiconductor chip SC2. For example, the first etch stop layer 112 may cover top surfaces of the first protection layer 110 and the second semiconductor chip SC2, and further cover sidewalls SW of the second semiconductor chip SC2. In some embodiments, the first etch stop layer 112 may be formed of a material having a high etching selectivity relative to the overlying or underlying layers to stop and control the etching of these layers. In a subsequent step, a gap fill layer 114 is formed over the first etch stop layer 112 to cover the first etch stop layer 112. In certain embodiments, the gap fill layer 114 is formed over the first protection layer 110 and covers the second semiconductor chip SC2. In certain embodiments, the first etch stop layer 112 is located in between (or sandwiched in between) the first protection layer 110 and the gap fill layer 114. In some embodiments, the gap fill layer 114 may be an oxide based dielectric material layer (e.g., silicon oxide), but the disclosure is not limited thereto. In certain embodiments, when both the first protection layer 110 and the gap fill layer 114 are made of oxide-based materials, then the first etch stop layer 112 may be silicon nitride, for example.

Figure 2C:
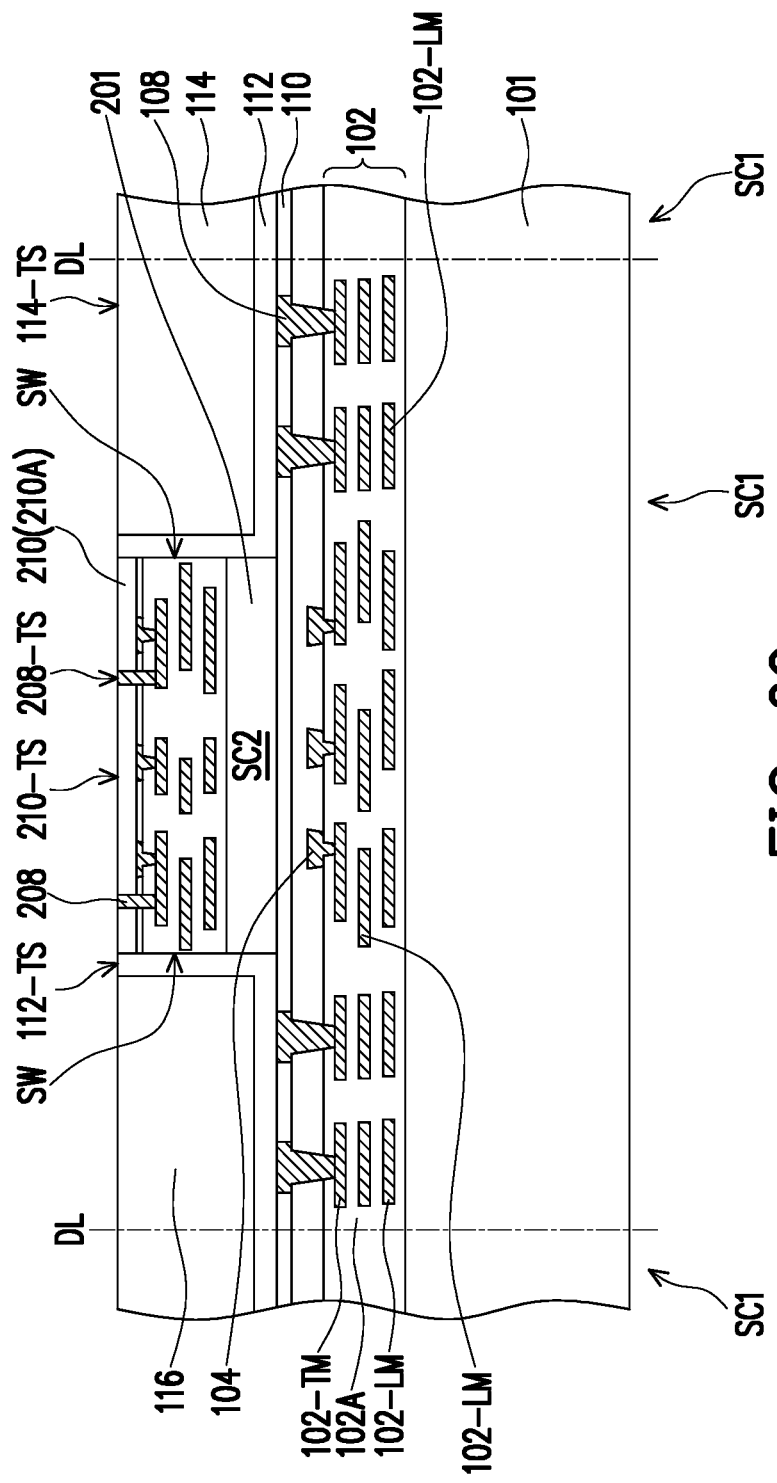

Referring to FIG. 2C, after forming the gap fill layer 114, a planarization process is performed to remove portions of the second protection layer 210 and to remove portions of gap fill layer 114. In some embodiments, at least the second protective portion 210B of the second protection layer 210 is removed. In other words, only the first protective portion 210A of the second protection layer 210 is remaining after the planarization process. In certain embodiments, the planarization process further removes portions of the first etch stop layer 112 so that the remaining portions of the first etch stop layer 112 covers a top surface of the first protection layer 110 and sidewalls SW of the second semiconductor chip SC2. In some embodiments, the second protection layer 210 and the gap fill layer 114 are ground or polished by a mechanical grinding process and/or a chemical mechanical polishing (CMP) process until the top surface 208-TS of the second conductive vias 208 are revealed. After the planarization or polishing process, the top surface 208-TS of the second conductive vias 208, a top surface 210-TS of the second protection layer, a top surface 112-TS of the first etch stop layer 112, and a top surface 114-TS of the gap fill layer 114 are coplanar and levelled with one another.

Figure 2D:
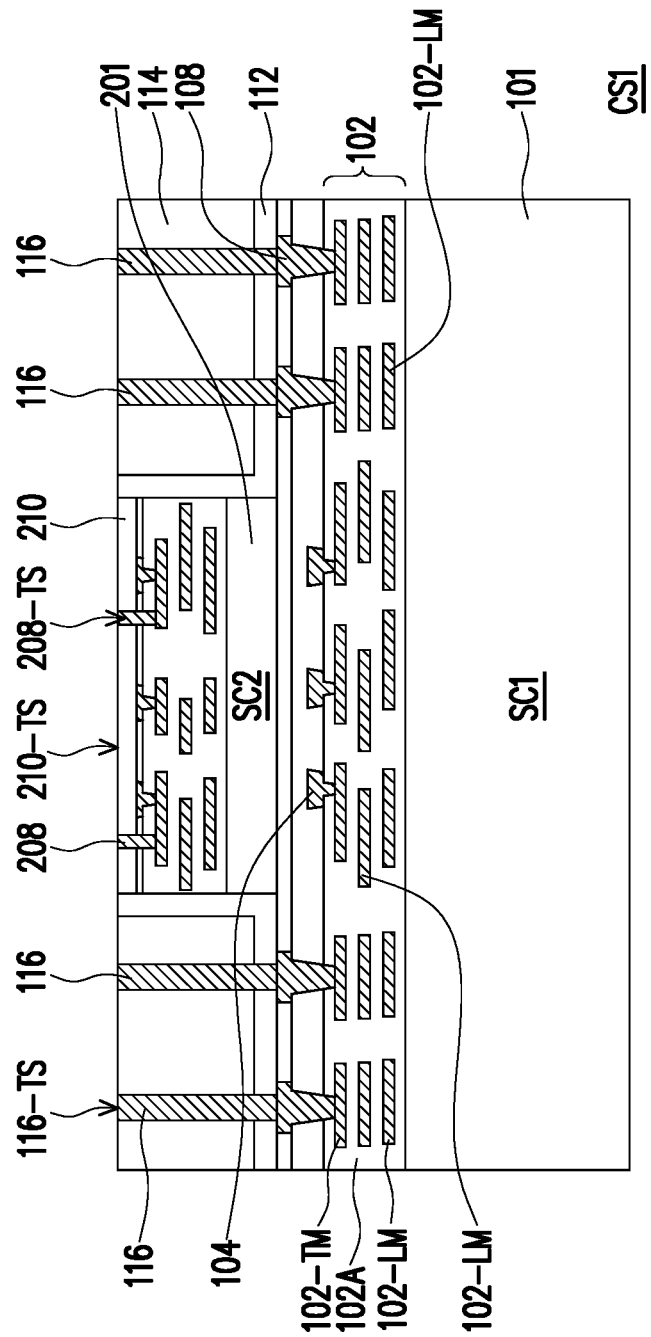

Referring to FIG. 2D, in a next step, the gap fill layer 114 and the etch stop layer 112 are etched, and a plurality of first conductive vias 116 is formed in the gap fill layer 114 and the etch stop layer 112. With the presence of the first etch stop layer 112, the first conductive vias 116 may be formed with sufficient uniformity. In other words, due to the different etch rate or etching selectivity of the gap fill layer 114 and the etch stop layer 112, the etching of these layers may be appropriately controlled. In some embodiments, the first conductive vias 116 are embedded in the gap fill layer 114 and being electrically connected with the first interconnection layer 102. In some embodiments, the first conductive vias 116 are formed to surround the second semiconductor chip SC2. In certain embodiments, the first conductive vias 116 is electrically connected to the first interconnection layer 102 through the first conductive posts 108. Furthermore, as illustrated in FIG. 2D, the first etch stop layer 112 and the gap fill layer 114 are in physical contact with the sidewalls of the first conductive vias 116. In other words, the first etch stop layer 112 and the gap fill layer 114 surrounds the first conductive vias 116. After forming the first conductive vias 116, a top surface 116-TS of the first conductive vias 116 is coplanar and levelled with the top surface 208-TS of the second conductive vias 208, the top surface 210-TS of the second protection layer 210, the top surface 112-TS of the first etch stop layer 112, and the top surface 114-TS of the gap fill layer 114. Thereafter, the semiconductor wafer WF1 may be diced along the dicing lines DL (shown in FIG. 2C) to separate the plurality of first semiconductor chips SC1 from one another. Up to here, a chip structure CS1 according to some exemplary embodiments of the present disclosure may be accomplished. In the completed chip structure CS1 (integrated chip structure), the second semiconductor chip SC2 is embedded within the first semiconductor chip SC1, and being surrounded by the gap fill layer 114 and the first conductive vias 116 of the first semiconductor chip SC1.

Furthermore, in the exemplary embodiment, the first semiconductor chip SC1 and the second semiconductor chip SC2 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto. For example, the first semiconductor chip SC1 and the second semiconductor chip SC2 may be the same type of chips or may be different type of chips.

Figure 3:
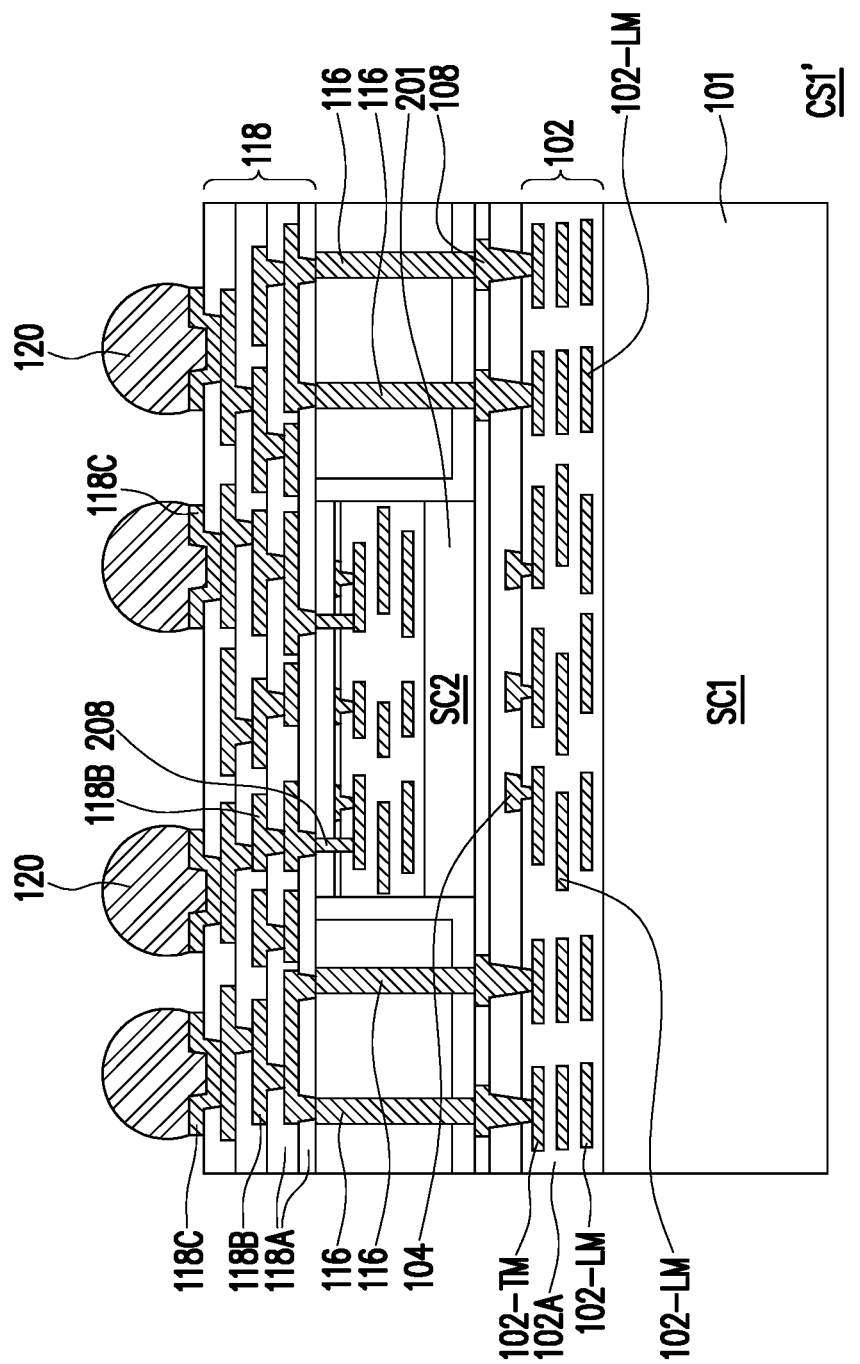
FIG. 3 is a schematic sectional view of a chip structure according to some other exemplary embodiments of the present disclosure.

FIG. 3 is a schematic sectional view of a chip structure according to some other exemplary embodiments of the present disclosure. The chip structure CS1' illustrated in FIG. 3 is similar to the chip structure CS1 illustrated in FIG. 2A to 2D. Therefore, the same reference numerals are used to refer to the same or liked parts, and its detailed description will not be repeated herein. The difference between the embodiments is that a redistribution layer 118 is further formed in FIG. 3 prior to the dicing process described in FIG. 2C to FIG. 2D. For example, after forming the first conductive vias 116, a redistribution layer 118 may be formed over the gap fill layer 114 of the first semiconductor chip SC1, and over the second semiconductor chip SC2. In some embodiments, the redistribution layer 118 is electrically connected to the plurality of first conductive vias 116 and the plurality of second conductive vias 208. In other words, the plurality of first conductive vias 116 and the plurality of second conductive vias 208 electrically communicate with one another through the redistribution layer 118. In some embodiments, the redistribution layer 118 may have a fine pitch (e.g. 0.8 μm) due to multi-chip stacking.

In some embodiments, the formation of the redistribution layer 118 includes sequentially forming one or more dielectric layers 118A, and one or more conductive layers 118B in alternation. In certain embodiments, the conductive layers 118B are sandwiched between the dielectric layers 118A.

Although only three layers of the conductive layers 118B and four layers of dielectric layers 118A are illustrated herein, however, the scope of the disclose is not limited by the embodiments of the disclosure. In other embodiments, the number of conductive layers 118B and the dielectric layers 118A may be adjusted based on product requirement. In some embodiments, the conductive layers 118B may be electrically connected to the plurality of first conductive vias 116 and the plurality of second conductive vias 208.

In certain embodiments, the material of the dielectric layers 118A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 118A may be formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 118B may be made of conductive materials formed by electroplating or deposition, such as aluminum, titanium, copper, nickel, tungsten, and/or alloys thereof, which may be patterned using a photolithography and etching process. In some embodiments, the conductive layer 118B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 118, a plurality of conductive pads 118C may be disposed on an exposed top surface of the topmost layer of the conductive layers 118B for electrically connecting with conductive balls. In certain embodiments, the conductive pads 118C are for example, under-ball metallurgy (UBM) patterns used for ball mount. As shown in FIG. 3, the conductive pads 118C are formed on and electrically connected to the redistribution layer 118. In some embodiments, the materials of the conductive pads 118C may include copper, nickel, titanium, tungsten, or alloys thereof or the like, and may be formed by an electroplating process, for example. The number of conductive pads 118C are not limited in this disclosure, and may be selected based on the design layout. In some alternative embodiments, the conductive pads 118C may be omitted. In other words, conductive balls 120 formed in subsequent steps may be directly disposed on the redistribution layer 118.

After forming the conductive pads 118C, a plurality of conductive balls 120 is disposed on the conductive pads 118C and over the redistribution layer 118. In some embodiments, the conductive balls 120 may be disposed on the conductive pads 118C by a ball placement process or reflow process. In some embodiments, the conductive balls 120 are, for example, solder balls or ball grid array (BGA) balls. In some embodiments, the conductive balls 120 are, for example, controlled collapse chip connection (C4) bumps or micro-bumps. The disclosure is not limited thereto. In some embodiments, the conductive balls 120 are connected to the redistribution layer 118 through the conductive pads 118C. In certain embodiments, some of the conductive balls 120 may be electrically connected to the first conductive vias 116, while some of the conductive balls 120 may be electrically connected to the second conductive vias 208 through the redistribution layer 118. Furthermore, in the exemplary embodiment, the number of the conductive balls 120 is not limited to the disclosure, and may be designated and selected based on the number of the conductive pads 118C. After forming the redistribution layer 118 and placing the conductive balls 120, the same dicing process may be performed (as described in FIG. 2D) to separate the plurality of first semiconductor chips SC1 from one another. Up to here, a chip structure CS1' shown in FIG. 3 according to some exemplary embodiments of the present disclosure may be accomplished.

Figure 4:
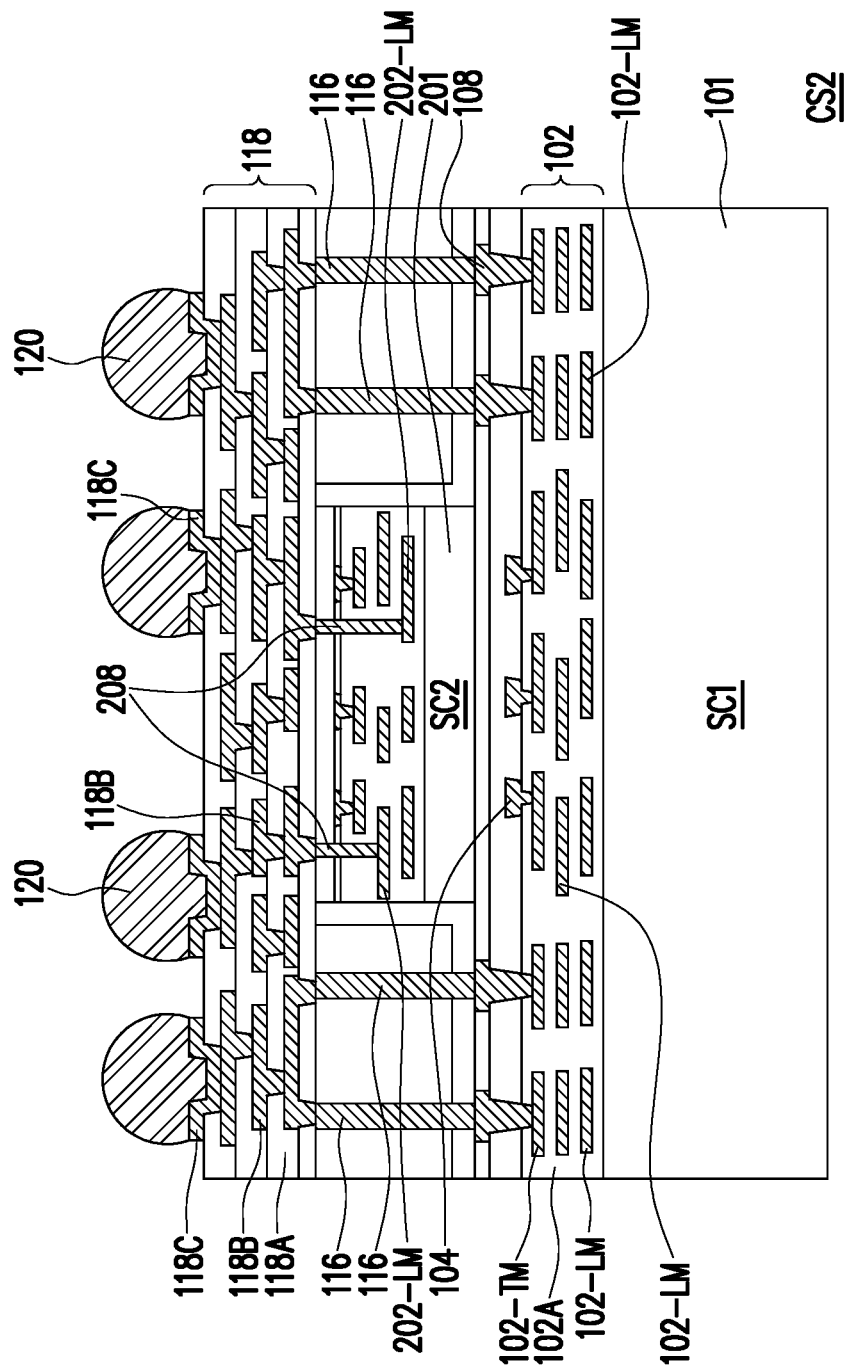
FIG. 4 is a schematic sectional view of a chip structure according to some other exemplary embodiments of the present disclosure.

FIG. 4 is a schematic sectional view of a chip structure according to some other exemplary embodiments of the present disclosure. The chip structure CS2 illustrated in FIG. 4 is similar to the chip structure CS1' illustrated in FIG. 3. Therefore, the same reference numerals are used to refer to the same or liked parts, and its detailed description will not be repeated herein. The difference between the embodiments is in the connection of the second conductive vias 208. As illustrated in FIG. 3, the second conductive vias 208 are physically connected to the top metallization layer 202-TM of the second interconnection layer 202. However, the disclosure is not limited thereto. For example, as illustrated in FIG. 4, the second conductive vias 208 may be physically connected to any one of the lower metallization layers 202-LM.

Figure 5:
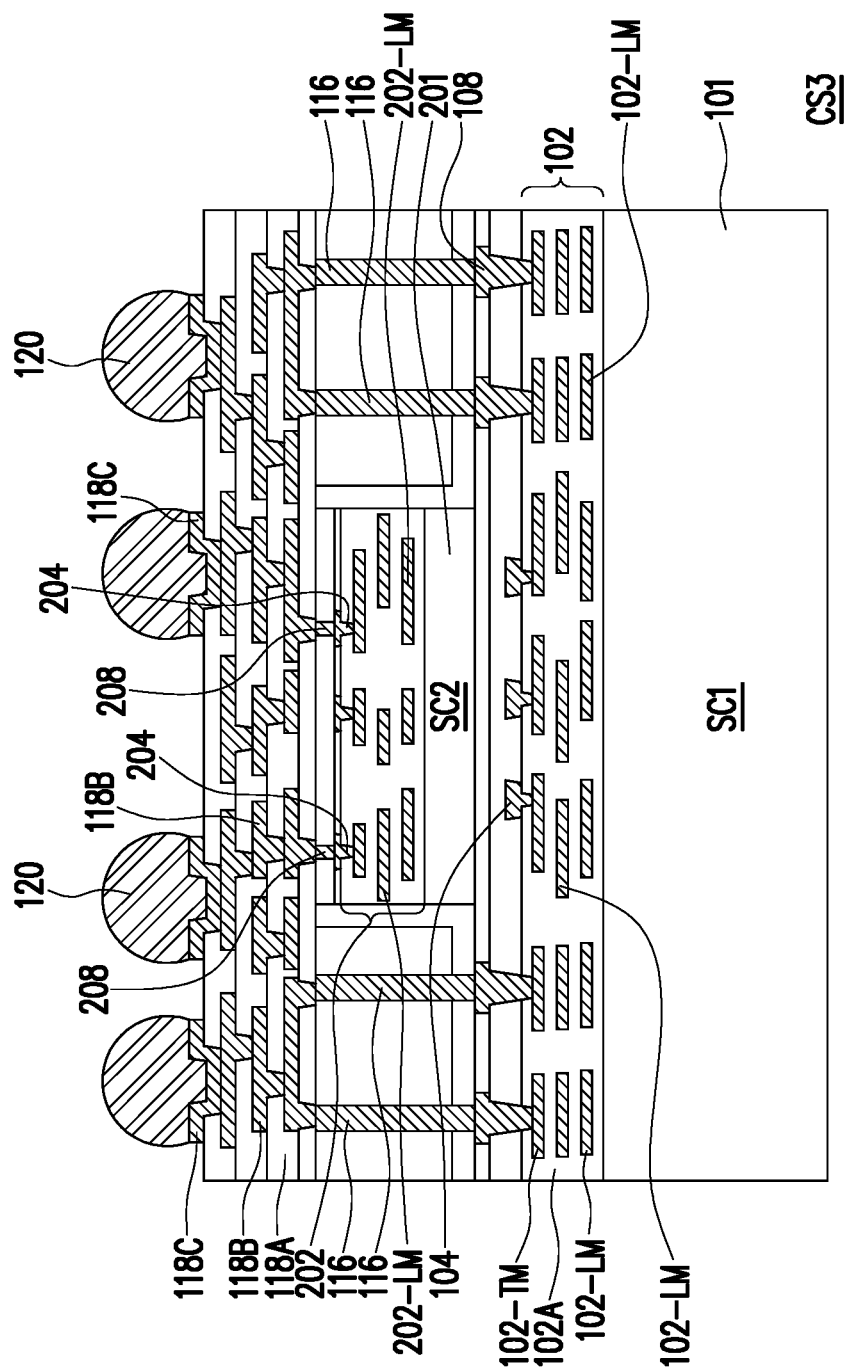
FIG. 5 is a schematic sectional view of a chip structure according to some other exemplary embodiments of the present disclosure.

FIG. 5 is a schematic sectional view of a chip structure according to some other exemplary embodiments of the present disclosure. The chip structure CS3 illustrated in FIG. 5 is similar to the chip structure CS1' illustrated in FIG. 3. Therefore, the same reference numerals are used to refer to the same or liked parts, and its detailed description will not be repeated herein. The difference between the embodiments is in the connection of the second conductive vias 208. For example, as illustrated in FIG. 5, the second conductive vias 208 are physically connected to the second conductive pads 204. In other words, the conductive vias 208 are electrically connected to the second interconnection layer 202 through the second conductive pads 204. This is different to the embodiment of FIG. 3, whereby the second conductive pads 204 are used as dummy pads.

Figure 6:
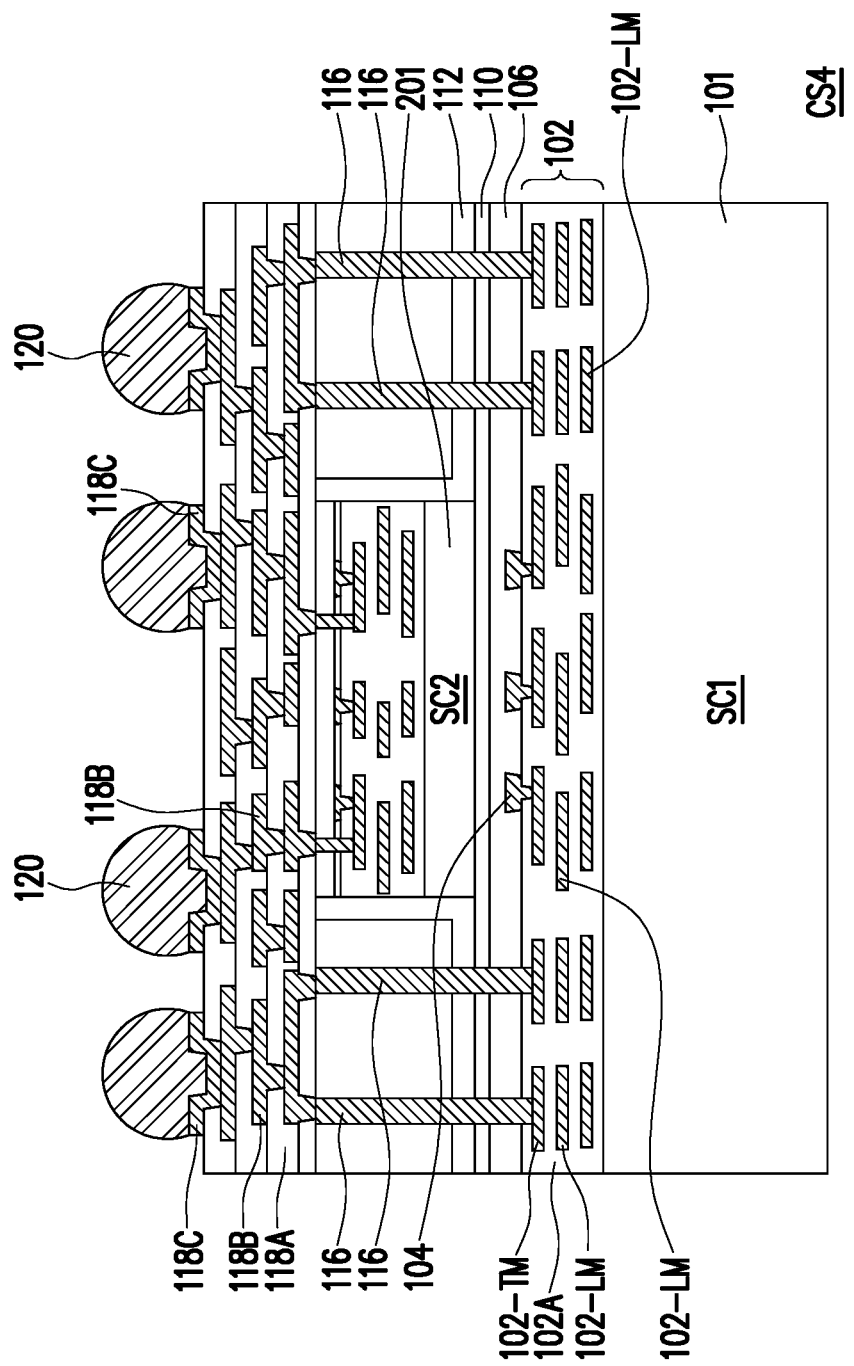
FIG. 6 is a schematic sectional view of a chip structure according to some other exemplary embodiments of the present disclosure.

FIG. 6 is a schematic sectional view of a chip structure according to some other exemplary embodiments of the present disclosure. The chip structure CS4 illustrated in FIG. 6 is similar to the chip structure CS1' illustrated in FIG. 3. Therefore, the same reference numerals are used to refer to the same or liked parts, and its detailed description will not be repeated herein. The difference between the embodiments is in the connection of the first conductive vias 116. As illustrated in FIG. 3, the first conductive vias 116 are electrically connected to the first interconnection layer 102 through first conductive posts 108. However, the disclosure is not limited thereto. For example, as illustrated in FIG. 6, the first conductive posts 108 may be omitted, and the first conductive vias 116 may be physically connected to the top metallization layer 102-TM of the first interconnection layer 102. In alternative embodiments, the first conductive vias 116 may be physically connected to any one of the lower metallization layers 102-LM.

Figure 7:
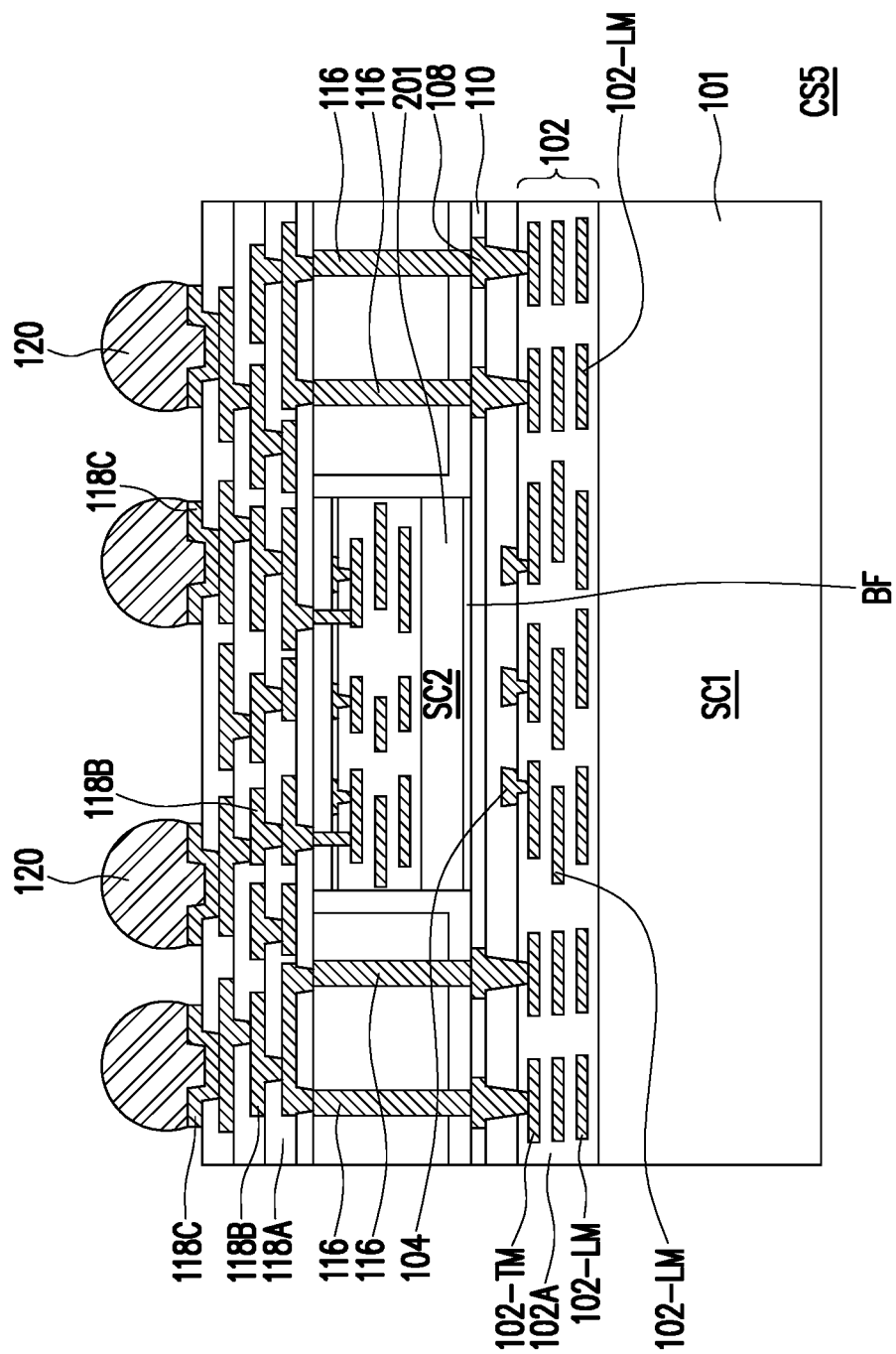
FIG. 7 is a schematic sectional view of a chip structure according to some other exemplary embodiments of the present disclosure.

FIG. 7 is a schematic sectional view of a chip structure according to some other exemplary embodiments of the present disclosure. The chip structure CS5 illustrated in FIG. 7 is similar to the chip structure CS1' illustrated in FIG. 3. Therefore, the same reference numerals are used to refer to the same or liked parts, and its detailed description will not be repeated herein. The difference between the embodiments is in the way of bonding the second semiconductor chip SC2 on the first protection layer 110 of the first semiconductor chip SC1. As illustrated in FIG. 3, the semiconductor substrate 201 of the second semiconductor chip SC2 is directly bonded onto the first protection layer 110 by fusion bonding. However, the disclosure is not limited thereto. For Example, as illustrated in FIG. 7, a bonding film BF may be further attached to the backside of the semiconductor substrate 201, and the second semiconductor chip SC2 is bonded onto the first protection layer 110 through the bonding film BF. In some embodiments, the bonding film BF may be any materials used for fusion bonding. For example, the bonding film BF may be an oxide-based film (e.g., silicon oxide film) used for oxide-oxide fusion bonding. In alternative embodiments, the bonding film BF may be an adhesive film such as a die attach film. The disclosure is not limited thereto.

Figure 8:
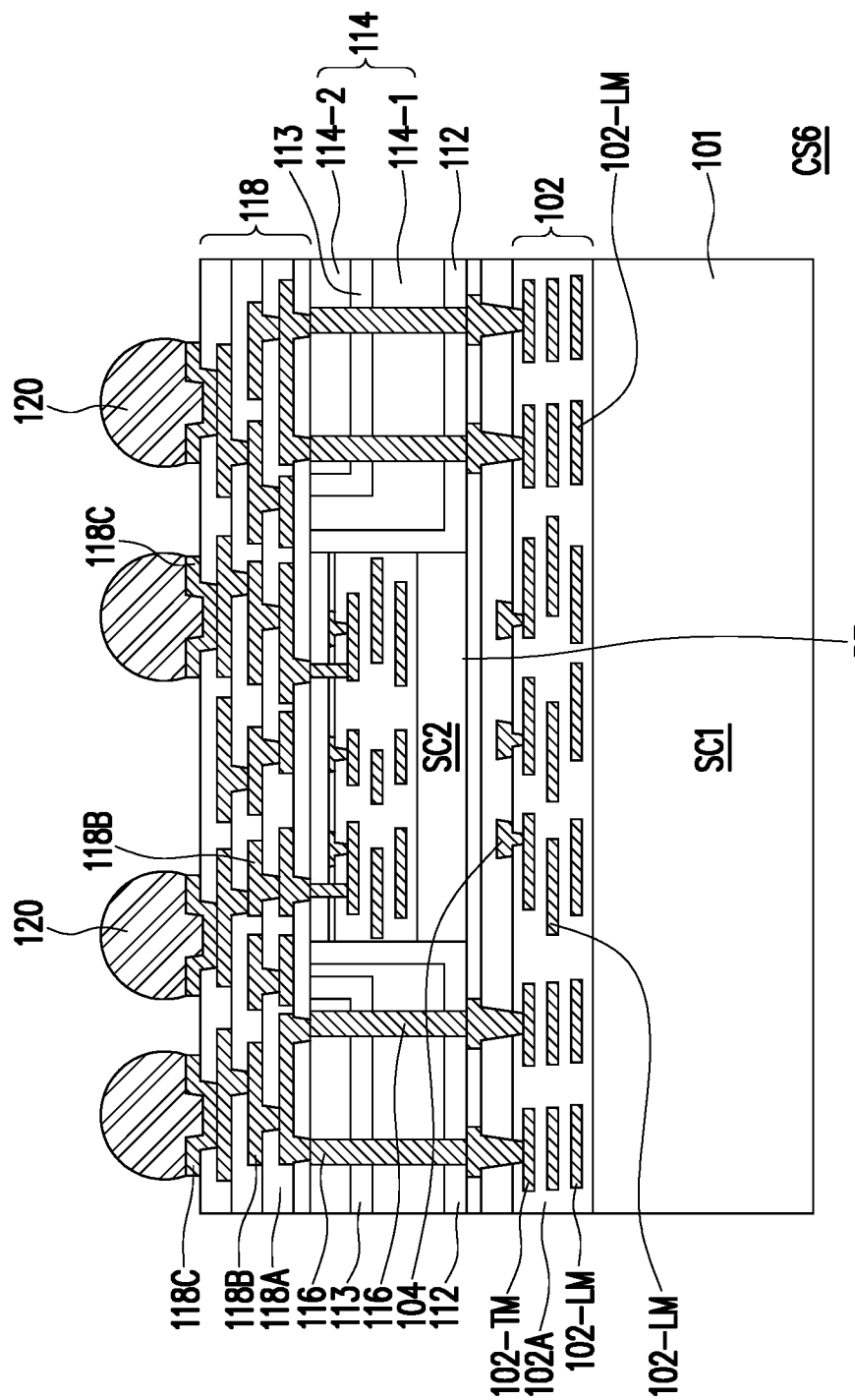
FIG. 8 is a schematic sectional view of a chip structure according to some other exemplary embodiments of the present disclosure.

FIG. 8 is a schematic sectional view of a chip structure according to some other exemplary embodiments of the present disclosure. The chip structure CS6 illustrated in FIG. 8 is similar to the chip structure CS1' illustrated in FIG. 3. Therefore, the same reference numerals are used to refer to the same or liked parts, and its detailed description will not be repeated herein. The difference between the embodiments is that a second etch stop layer 113 is further included. For example, the structure illustrated in FIG. 8 may be fabricated by sequentially forming the first etch stop layer 112, the first sub-layer 114-1, the second etch stop layer 113 and the second sub-layer 114-2, wherein the first sub-layer 114-1 and the second sub-layer 114-2 constitute the gap fill layer 114. After planarization of these layers, the first conductive vias 116 may be formed to penetrate through the second sub-layer 114-2, the second etch stop layer 113, the first sub-layer 114-1 and the first etch stop layer 112. In some embodiments, the second etch stop layer 113 may be formed of a material having a high etching selectivity relative to the overlying or underlying layers to be used to stop and control the etching of these layers. In certain embodiments, when both the first sub-layer 114-1 and the second sub-layer 114-2 of the gap fill layer 114 are made of oxide-based materials, then the second etch stop layer 113 may be silicon nitride, for example. By using the second etch stop layer 113 in combination with the first etch stop layer 112, the first conductive vias 116 may be formed with sufficient uniformity.

As illustrated in FIG. 8, after completing the formation of the second etch stop layer 113 and the first conductive vias 116, the same steps of forming the redistribution layer 118 and the conductive balls 120 may be performed to fabricate the chip structure CS6. For example, in the completed structure, the second etch stop layer 113 is located in between the first sub-layer 114-1 and the second sub-layer 114-2 of the gap fill layer 114, and physically separate the first sub-layer 114-1 from the second sub-layer 114-2. Furthermore, the sidewalls of the first conductive vias 116 is in physical contact with the second sub-layer 114-2, the second etch stop layer 113, the first sub-layer 114-1 and the first etch stop layer 112. In other words, the first conductive vias 116 is surrounded by the second sub-layer 114-2, the second etch stop layer 113, the first sub-layer 114-1 and the first etch stop layer 112.

Figure 9:
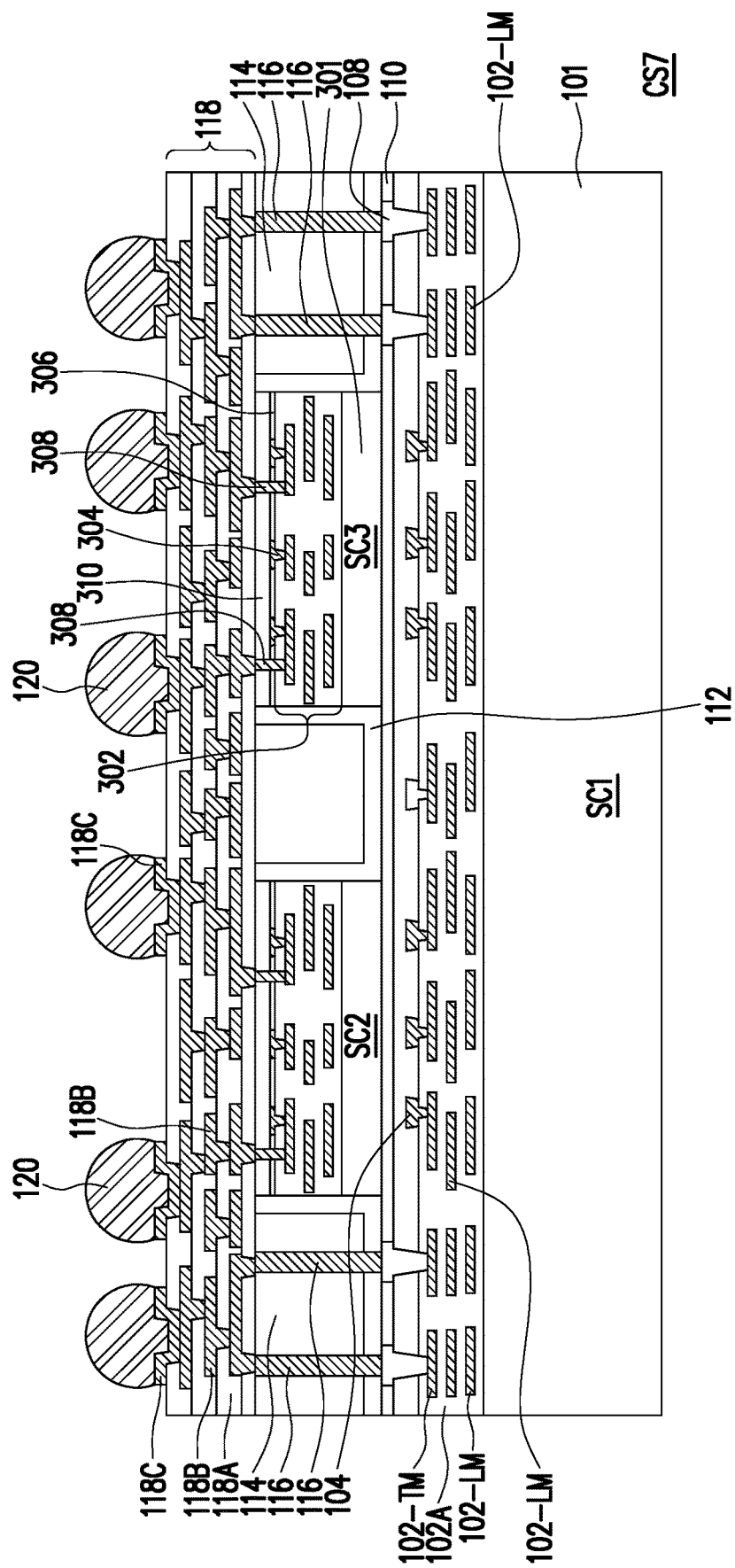
FIG. 9 is a schematic sectional view of a chip structure according to some other exemplary embodiments of the present disclosure.

FIG. 9 is a schematic sectional view of a chip structure according to some other exemplary embodiments of the present disclosure. The chip structure CS7 illustrated in FIG. 9 is similar to the chip structure CS1' illustrated in FIG. 3. Therefore, the same reference numerals are used to refer to the same or liked parts, and its detailed description will not be repeated herein. The difference between the embodiments is that a third semiconductor chip SC3 is further included. As illustrated in FIG. 9, the third semiconductor chip SC3 is bonded onto the first protection layer 110 of the first semiconductor chip SC1, and is located aside the second semiconductor chip SC2. In the exemplary embodiment, the third semiconductor chip SC3 includes a third semiconductor substrate 301, a third interconnection layer 302, a plurality of third conductive pads 304, a dielectric layer 306, a plurality of third conductive vias 308, and a third protection layer 310. These elements of the third semiconductor chip SC3 may be similar to the second semiconductor substrate 201, the second interconnection layer 202, the second conductive pads 204, the dielectric layer 206, the second conductive vias 208 and the second protection layer 210 of the second semiconductor chip SC2, hence its detailed description may be referred thereto. Briefly, the third interconnection layer 302 is located on the third semiconductor substrate 301, the third protection layer 310 is located on the third interconnection layer 302, and the third conductive vias 308 are embedded in the third protection layer 310 and electrically connected with the third interconnection layer 302.

In the illustrated embodiment, the third semiconductor chip SC3 is embedded within the first semiconductor chip SC1 and surrounded by the gap fill layer 114 and the first conductive vias 116. Furthermore, the third semiconductor substrate 301 of the third semiconductor chip SC3 is directly bonded to the first protection layer 110 by fusion bonding. For example, through oxide-oxide fusion bonding, or silicon-oxide fusion bonding. In some embodiments, the redistribution layer 118 may be electrically connected to the third conductive vias 308 of the third semiconductor chip SC3. In some embodiments, the first semiconductor chip SC1 and the second semiconductor chip may be electrically connected to the third semiconductor chip SC3 through the redistribution layer 118. In certain embodiments, the first etch stop layer 112 further cover sidewalls of the third semiconductor chip SC3.

Figure 10:
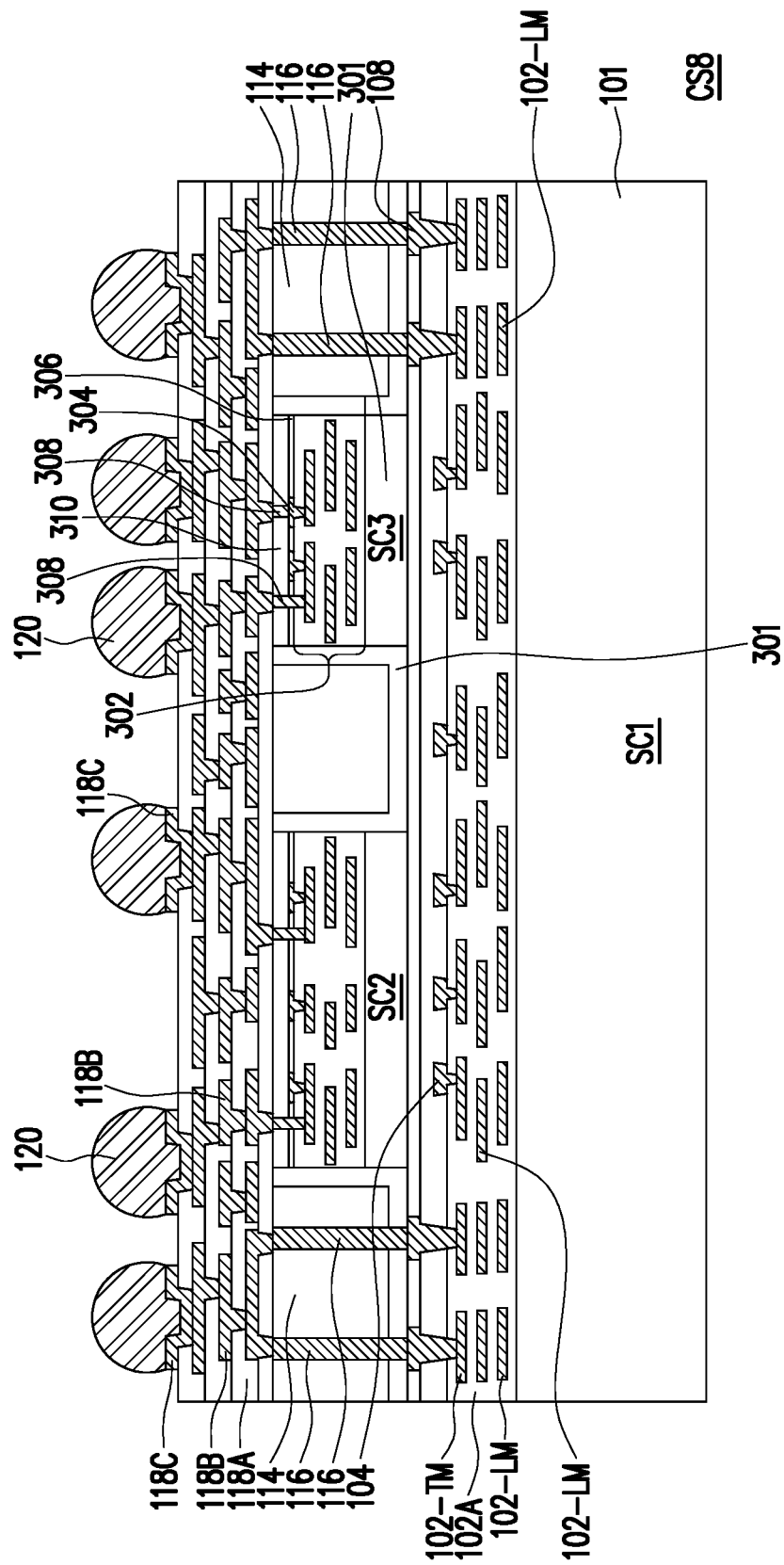
FIG. 10 is a schematic sectional view of a chip structure according to some other exemplary embodiments of the present disclosure.

FIG. 10 is a schematic sectional view of a chip structure according to some other exemplary embodiments of the present disclosure. The chip structure CS8 illustrated in FIG. 10 is similar to the chip structure CS7 illustrated in FIG. 9. Therefore, the same reference numerals are used to refer to the same or liked parts, and its detailed description will not be repeated herein. The difference between the embodiments is in the size of the third semiconductor chip SC3. As illustrated in FIG. 9, the size of the third semiconductor chip SC3 is substantially the same as the size of the second semiconductor chip SC2. However, the disclosure is not limited thereto. As illustrated in FIG. 10, the size of the third semiconductor chip SC3 is smaller than the size of the second semiconductor chip SC2. In other words, the second semiconductor chip SC2 and the third semiconductor chip SC3 may different type of chips. However, the disclosure is not limited thereto, and semiconductor chips with different sizes may be appropriately selected based on design requirements.

Figure 11:
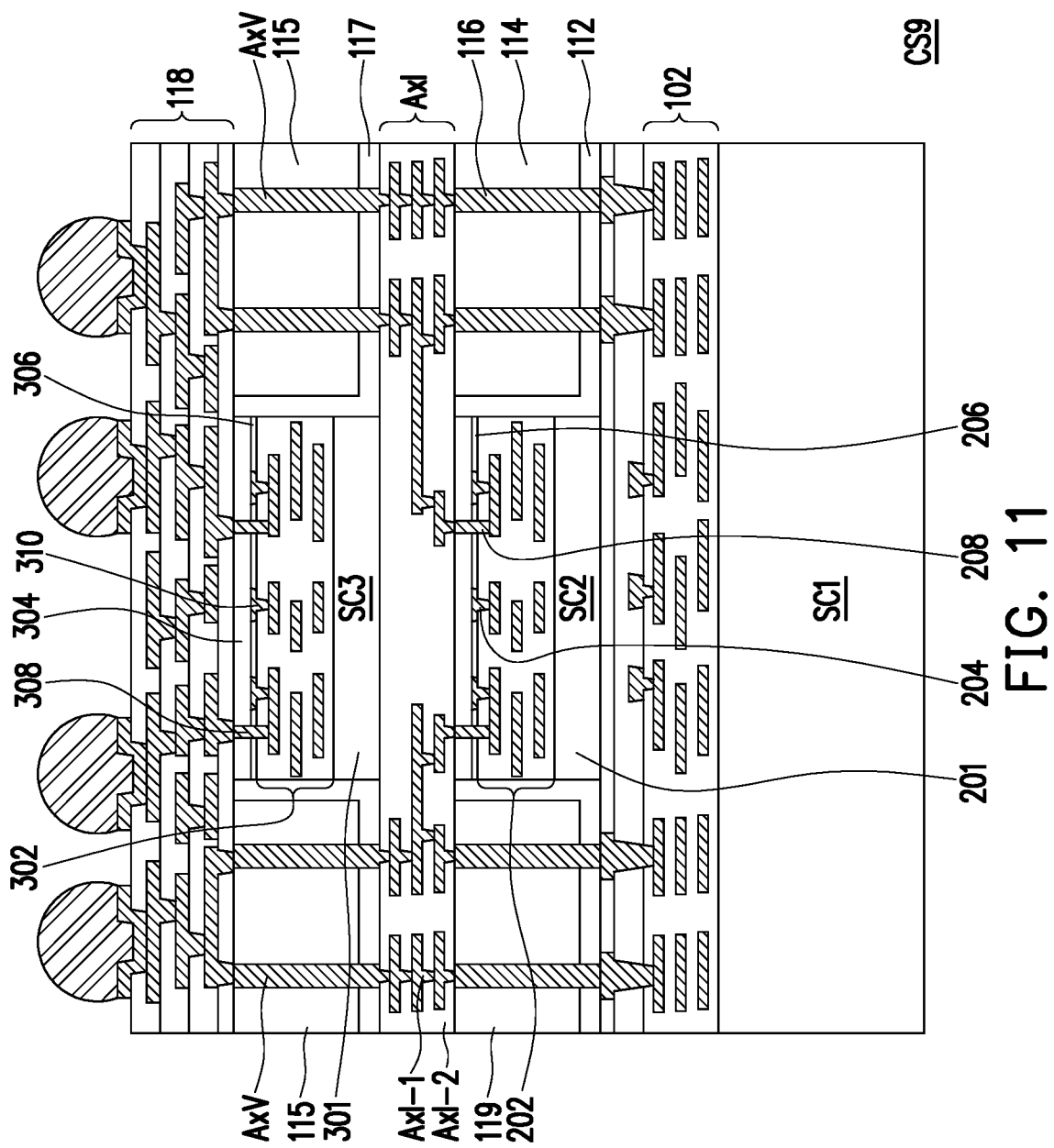
FIG. 11 is a schematic sectional view of a chip structure according to some other exemplary embodiments of the present disclosure.

FIG. 11 is a schematic sectional view of a chip structure according to some other exemplary embodiments of the present disclosure. The chip structure CS9 illustrated in FIG. 11 is similar to the chip structure CS7 illustrated in FIG. 9. Therefore, the same reference numerals are used to refer to the same or liked parts, and its detailed description will not be repeated herein. The difference between the embodiments is in the position of the third semiconductor chip SC3. As illustrated in FIG. 11, the third semiconductor chip SC3 is located over the second semiconductor chip SC2. In some embodiments, a second gap fill layer 115 (similar to that of the first gap fill layer 114) may be formed to surround the third semiconductor chip SC3. In certain embodiments, auxiliary conductive vias AxV (similar to the first conductive vias 116) may be embedded within the second gap fill layer 115. Furthermore, an auxiliary interconnection layer AxI may be located in between the first gap fill layer 114 and the second gap fill layer 115 for providing electrical connection therebetween. In some embodiments, the auxiliary interconnection layer AxI includes a plurality of metallization layers AxI-1 and a plurality of inter-dielectric layers AxI-2 stacked alternately. The number of metallization layers AxI-1 and inter-dielectric layers AxI-2 is not limited thereto, and may be adjusted based on requirement.

In some embodiments, the auxiliary interconnection layer AxI is electrically connected with the plurality of first conductive vias 116, the plurality of second conductive vias 208, and the plurality of auxiliary conductive vias AxV. In certain embodiments, the third semiconductor substrate 301 is bonded onto the inter-dielectric layers AxI-2 of the auxiliary interconnection layer AxI through fusion bonding. For example, the fusion bonding may be oxide-oxide fusion bonding and silicon-oxide fusion bonding. The disclosure is not limited thereto. In certain embodiments, a second etch stop layer 117 (similar to that of the first etch stop layer 112) may be formed on the auxiliary interconnection layer AxI, covering sidewalls of the third semiconductor chip SC3 and covering the upper surface of the auxiliary interconnection layer AxI. The redistribution layer 118 subsequently formed may then be electrically connected to the third conductive vias 308 and the auxiliary conductive vias AxV.

Figure 12A:
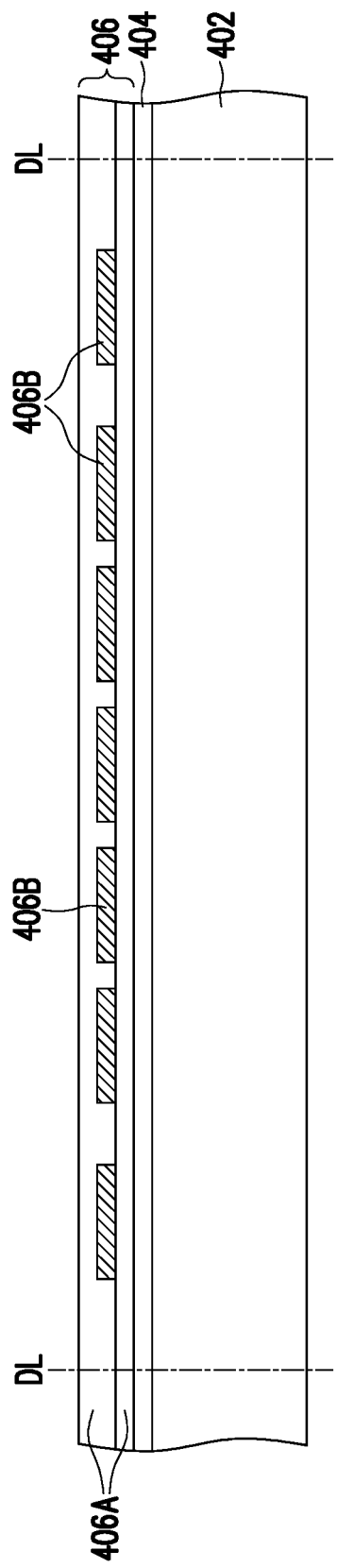
FIG. 12A to FIG. 12G are schematic sectional views of various stages in a method of fabricating a package structure according to some exemplary embodiments of the present disclosure.

FIG. 12A to FIG. 12G are schematic sectional views of various stages in a method of fabricating a package structure according to some exemplary embodiments of the present disclosure. Referring to FIG. 12A, a carrier 402 is provided. In some embodiments, the carrier 402 may be a glass carrier or any suitable carrier for carrying a semiconductor wafer or a reconstituted wafer for the manufacturing method of the package structure. In some embodiments, the carrier 402 is coated with a debond layer 404. The material of the debond layer 404 may be any material suitable for bonding and de-bonding the carrier 402 from the above layer(s) or any wafer(s) disposed thereon.

In some embodiments, the debond layer 404 may include a dielectric material layer made of a dielectric material including any suitable polymer-based dielectric material (such as benzocyclobutene ("BCB"), polybenzoxazole ("PBO")). In an alternative embodiment, the debond layer 304 may include a dielectric material layer made of an epoxy-based thermal-release material, which loses its adhesive property when heated, such as a light-to-heat-conversion (LTHC) release coating film. In a further alternative embodiment, the debond layer 404 may include a dielectric material layer made of an ultra-violet (UV) glue, which loses its adhesive property when exposed to UV lights. In certain embodiments, the debond layer 404 may be dispensed as a liquid and cured, or may be a laminate film laminated onto the carrier 402, or may be the like. The top surface of the debond layer 404, which is opposite to a bottom surface contacting the carrier 402, may be levelled and may have a high degree of coplanarity. In certain embodiments, the debond layer 404 is, for example, a LTHC layer with good chemical resistance, and such layer enables room temperature de-bonding from the carrier 402 by applying laser irradiation, however the disclosure is not limited thereto.

In an alternative embodiment, a buffer layer (not shown) may be coated on the debond layer 404, where the debond layer 404 is sandwiched between the buffer layer and the carrier 402, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

As further illustrated in FIG. 12A, a redistribution layer 406 is formed over the carrier 402. For example, the redistribution layer 406 is formed on the debond layer 404, and the formation of the redistribution layer 406 includes sequentially forming one or more dielectric layers 406A and one or more conductive layers 406B in alternation. In some embodiments, the redistribution layer 406 includes two dielectric layers 406A and one conductive layer 406B as shown in FIG. 12A, where the conductive layer 406B is sandwiched between the dielectric layers 406A. However, the disclosure is not limited thereto. The numbers of the dielectric layers 406A and the conductive layer 406B included in the redistribution layer 406 is not limited thereto, and may be designated and selected based on the demand. For example, the numbers of the dielectric layers 406A and the conductive layers 406B may be one or more than one.

In certain embodiments, the material of the dielectric layers 406A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 406A may be formed by suitable fabrication techniques such as spin-on coating, chemical vapor deposition (CVD), plasma-enhanced chemical vapor deposition (PECVD) or the like. The disclosure is not limited thereto. In some embodiments, the material of the conductive layer 406B may be made of conductive materials formed by electroplating or deposition, such as aluminum, titanium, copper, nickel, tungsten, and/or alloys thereof, which may be patterned using a photolithography and etching process. In some embodiments, the conductive layer 406B may be patterned copper layers or other suitable patterned metal layers.

Figure 12B:
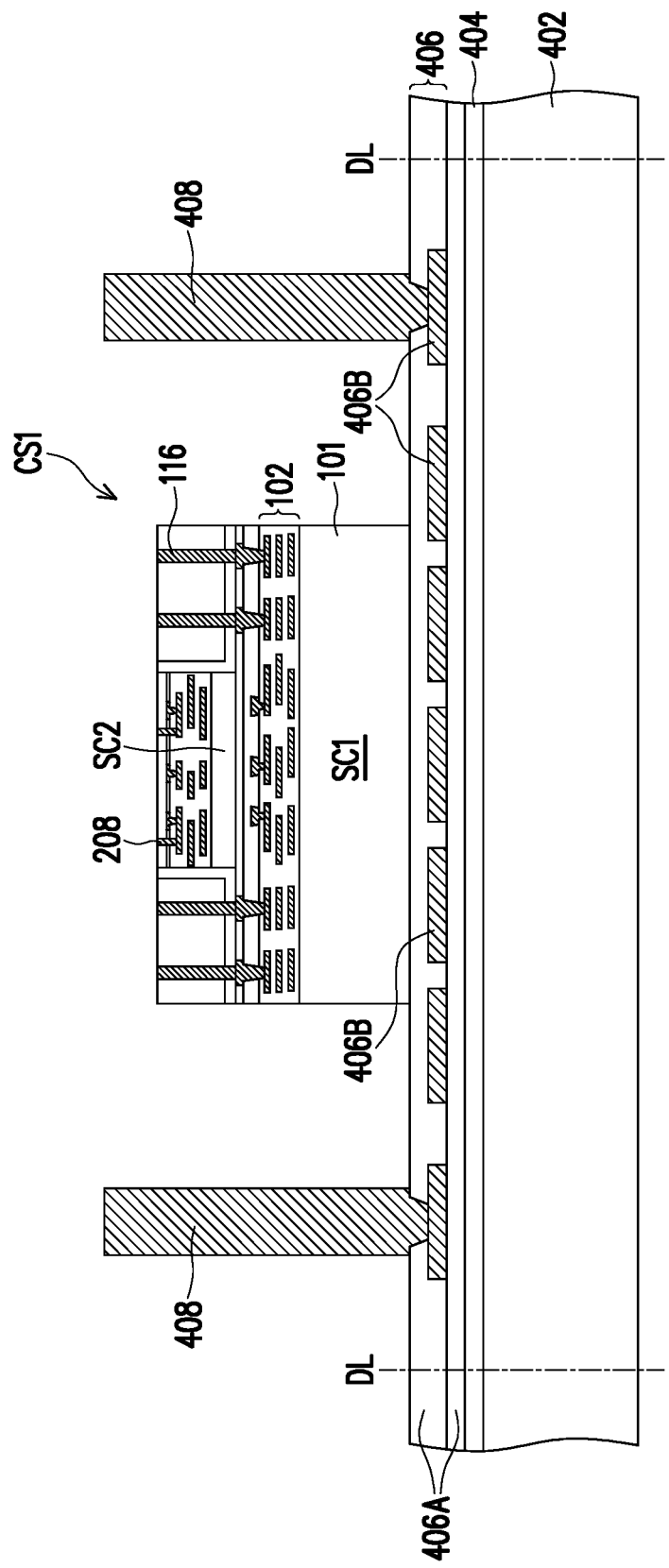

Referring to FIG. 12B, after forming the redistribution layer 406, at least one chip structure CS1 obtained in FIG. 2D, and a plurality of through insulator vias 408 are provided on the redistribution layer 406 and over the carrier 402. In some embodiments, the through insulator vias 408 are through integrated fan-out ("InFO") vias. In one embodiment, the formation of the through insulator vias 408 includes forming a mask pattern (not shown) with openings, then forming a metallic material (not shown) filling up the openings by electroplating or deposition, and removing the mask pattern to form the through insulator vias 408 on the redistribution layer 406. In certain embodiments, the through insulator vias 408 fills into a via opening that reveals the conductive layer 406B of the redistribution layer 406, so that the through insulator vias 408 may be electrically connected to the redistribution layer 406. In some embodiments, the material of the mask pattern may include a positive photo-resist or a negative photo-resist. In one embodiment, the material of the through insulator vias 408 may include a metal material such as copper or copper alloys, or the like. However, the disclosure is not limited thereto.

In an alternative embodiment, the through insulator vias 408 may be formed by forming a seed layer (not shown) on the redistribution layer 406; forming the mask pattern with openings exposing portions of the seed layer; forming the metallic material on the exposed portions of the seed layer to form the through insulator vias 408 by plating; removing the mask pattern; and then removing portions of the seed layer exposed by the through insulator vias 408. For example, the seed layer may be a titanium/copper composited layer. For simplification, only two through insulator vias 408 are illustrated in FIG. 12B. However, it should be noted that the number of through insulator vias 408 is not limited thereto, and can be selected based on requirement.

Furthermore, in some embodiments, at least one chip structure CS1 is picked and placed on the redistribution layer 406. In certain embodiments, the chip structure CS1 is placed on the redistribution layer 406 in a way that the first semiconductor substrate 101 of the first semiconductor chip SC1 is attached to the dielectric layer 406A of the redistribution layer 406. For example, the first semiconductor substrate 101 is attached to the redistribution layer 406 through a die attach film (not shown) or through fusion bonding. In the exemplary embodiment, only one chip structure CS1 is illustrated. However, it should be noted that the number of chip structure CS1 placed on the redistribution layer 406 is not limited thereto, and this can be adjusted based on design requirement.

In some embodiments, when more than one chip structures CS1 are placed on the redistribution layer 406, the chip structures CS1 may be arranged in an array, and when the chip structures CS1 are arranged in an array, the through insulator vias 408 may be classified into groups. The number of the chip structures CS1 may correspond to the number of groups of the through insulator vias 408. In the exemplary embodiment, the chip structures CS1 may be picked and placed on the redistribution layer 406 after the formation of the through insulator vias 408. However, the disclosure is not limited thereto. In some alternative embodiments, the chip structures CS1 may be picked and placed on the redistribution layer 406 before the formation of the through insulator vias 408.

Figure 12C:
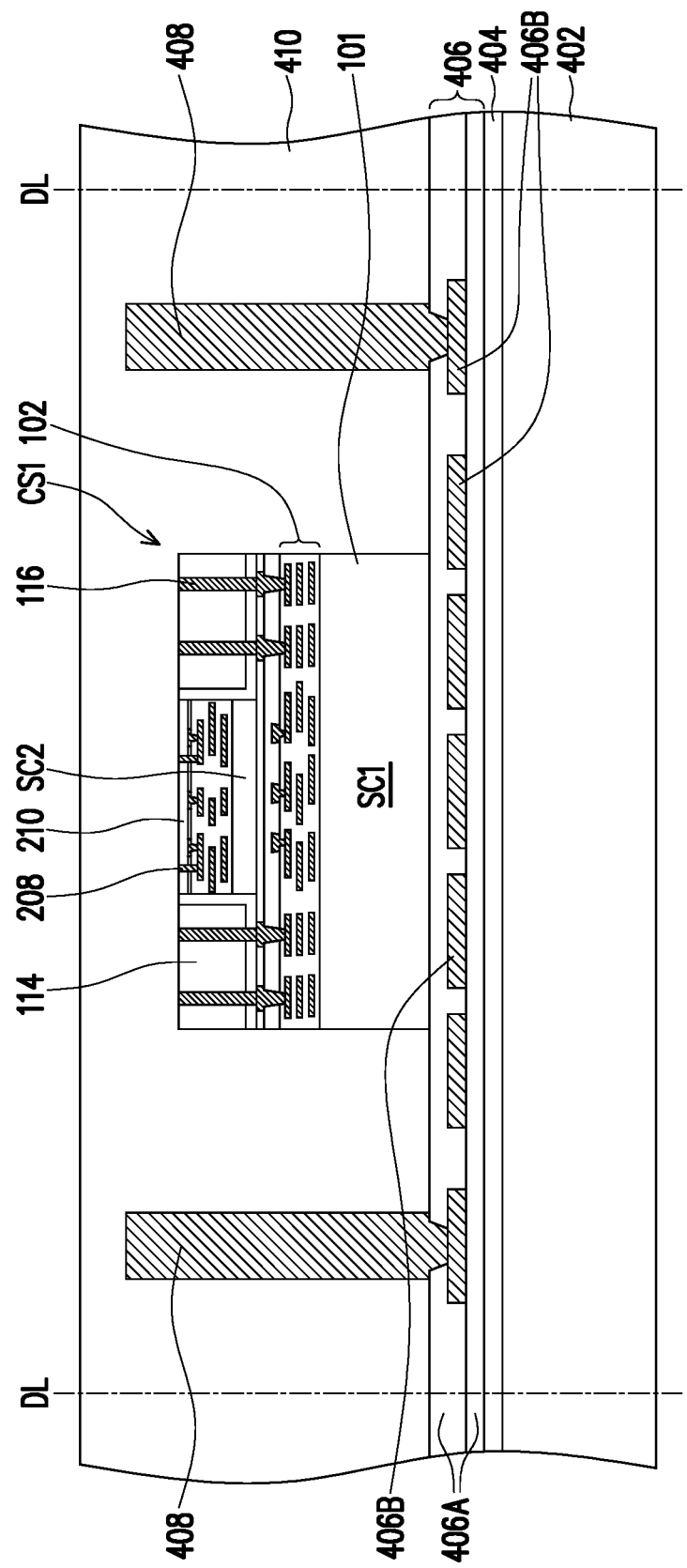

Referring to FIG. 12C, in a next step, an insulating material 410 is formed on the redistribution layer 406 and over the chip structure CS1. In some embodiments, the insulating material 410 is formed through, for example, a compression molding process, filling up the gaps between the chip structure CS1 and the through insulating vias 408 to encapsulate the chip structure CS1. The insulating material 410 also fills up the gaps between adjacent through insulator vias 408 to encapsulate the through insulator vias 408. At this stage, the gap fill layer 114, the first conductive vias 116, the second conductive vias 208 and the second protection layer 210 are encapsulated by and well protected by the insulating material 410. In other words, the gap fill layer 114, the first conductive vias 116, the second conductive vias 208 and the second protection layer 210 of the chip structure CS1 are not revealed.

In some embodiments, the insulating material 410 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating material 410 may include an acceptable insulating encapsulation material. In some embodiments, the insulating material 410 may further include inorganic filler or inorganic compound (e.g. silica, clay, and so on) which can be added therein to optimize coefficient of thermal expansion (CTE) of the insulating material 410. The disclosure is not limited thereto.

Figure 12D:
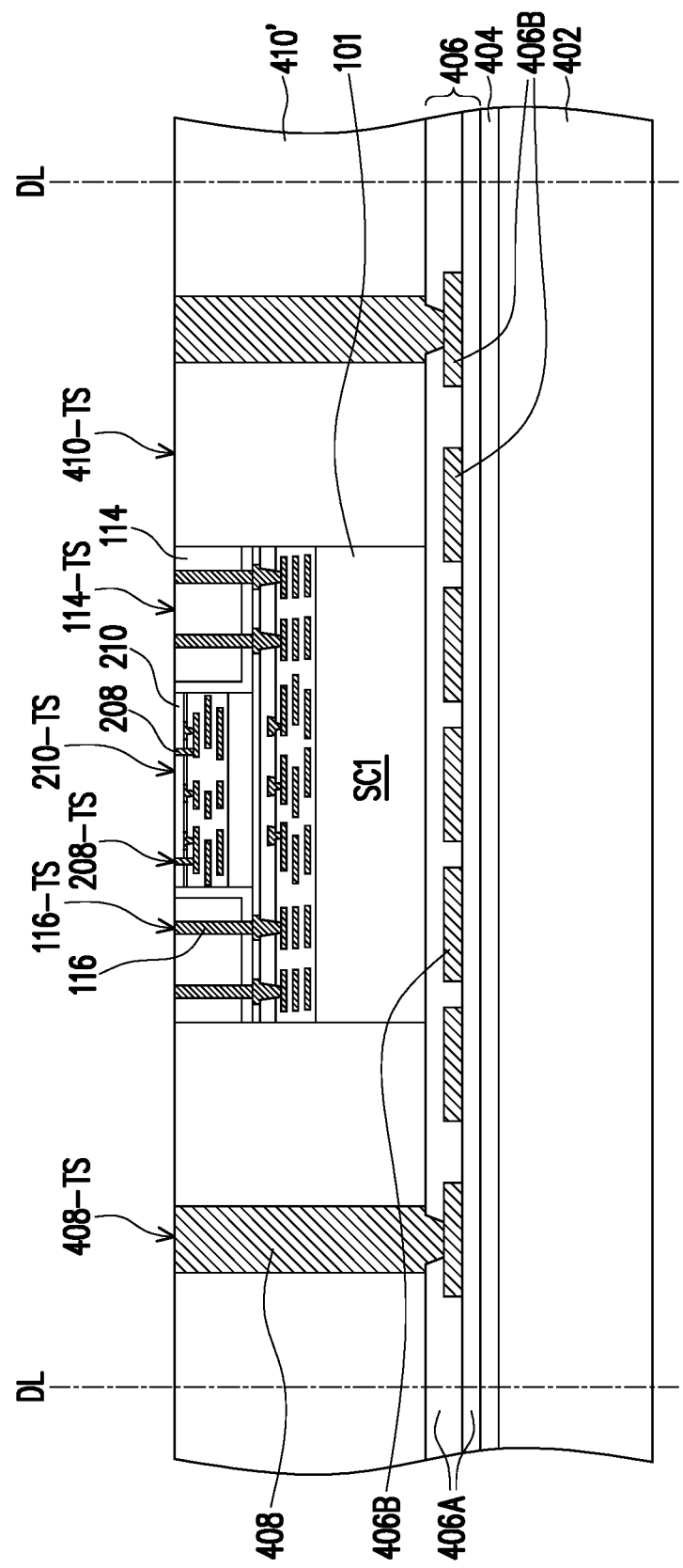

Referring to FIG. 12D, in some embodiments, the insulating material 410 is partially removed to expose the through insulator vias 408, the first conductive vias 116 and the second conductive vias 208. In some embodiments, the insulating material 410 is ground or polished by a planarization step. For example, the planarization step is performed through a mechanical grinding process and/or a chemical mechanical polishing (CMP) process until a top surface 116-TS of the first conductive vias 116 and a top surface 208-TS of the second conductive vias 208 are revealed. In some embodiments, the through insulator vias 408 may be partially polished so that the top surfaces 408-TS of the through insulator vias 408 are levelled with the top surface 116-TS of the first conductive vias 116 and the top surface 208-TS of the second conductive vias 208. In other words, the through insulator vias 408, the first conductive vias 116 and the second conductive vias 208 may also be slightly grinded/polished.

In the illustrated embodiment, the insulating material 410 is polished to form an insulating encapsulant 410'. In some embodiments, the top surface 410-TS of the insulating encapsulant 410', the top surface 408-TS of the through insulator vias 408, the top surface 116-TS of the first conductive vias 116, the top surface 114-TS of the gap fill layer 114, the top surface 208-TS of the second conductive vias 208, and the top surface 210-TS of the second protection layer 210 are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 12E:
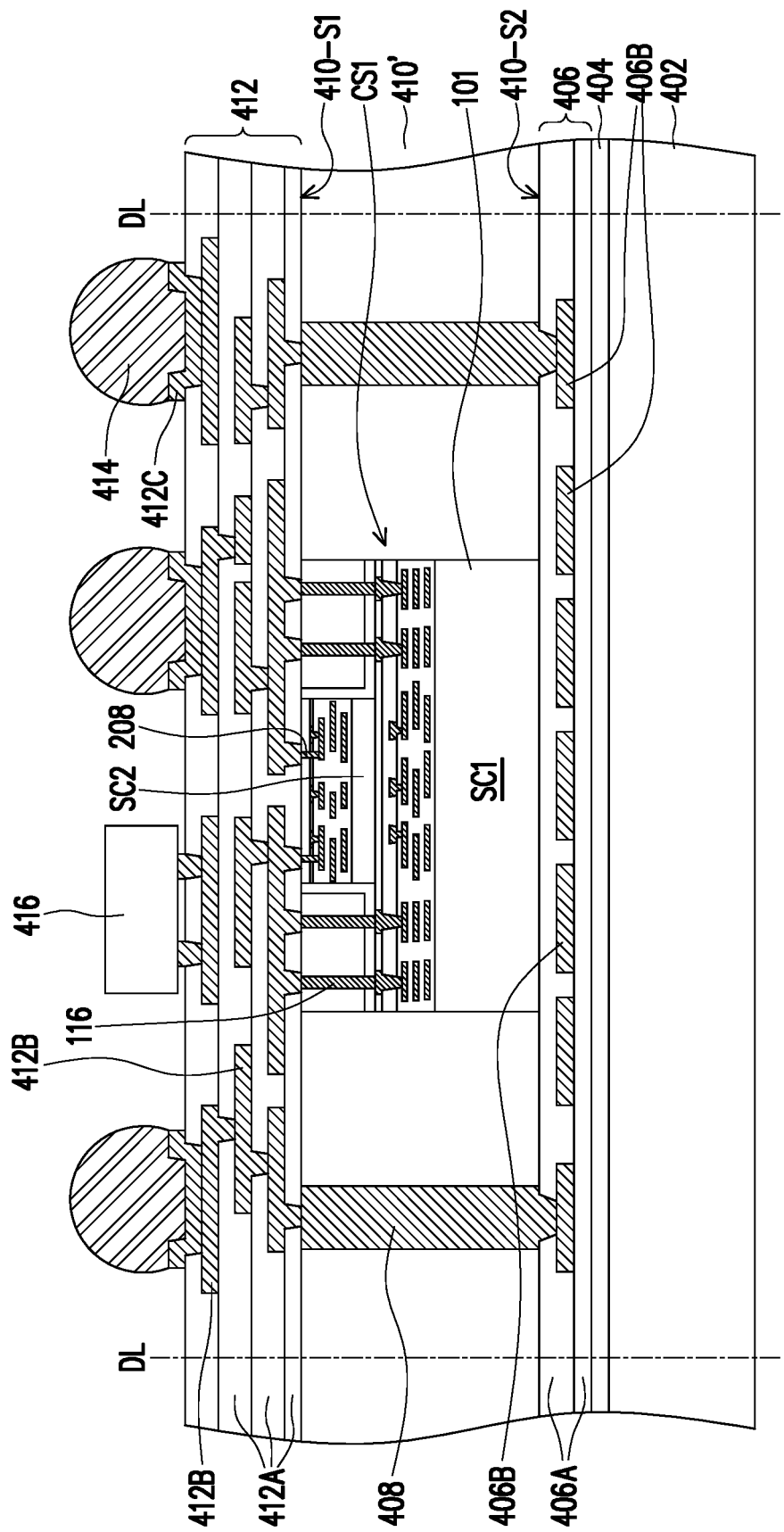

Referring to FIG. 12E, after the grinding/polishing step, a redistribution layer 412 is formed on the insulating encapsulant 410', the through insulator vias 408 and on the chip structure CS1. For example, the insulating encapsulant 410' has a first surface 410-S1 and a second surface 410-S2 opposite to the first surface 410-S1, wherein the redistribution layer 412 is formed on the first surface 410-S1, and the redistribution layer 406 is formed on the second surface 410-S2 of the insulating encapsulant 410'. In some embodiments, the redistribution layer 412 is electrically to the through insulator vias 408, and is electrically connected to the first semiconductor chip SC1 and the second semiconductor chip SC2 through the first conductive vias 116 and the second conductive vias 208 respectively. In certain embodiments, the redistribution layer 412 electrically connects the first conductive vias 116 of the first semiconductor chip SC1 to the second conductive vias 208 of the second semiconductor chip SC2. In other words, the first semiconductor chip SC1 is electrically connected with the second semiconductor chip SC2 through the first conductive vias 116, the redistribution layer 412 and the second conductive vias 208. In some embodiments, the chip structure CS1 is electrically connected to the through insulator vias 408 through the redistribution layer 412.

Furthermore, in some embodiments, the formation of the redistribution layer 412 includes sequentially forming one or more dielectric layers 412A, and one or more conductive layers 412B in alternation. In certain embodiments, the conductive layers 412B are sandwiched between the dielectric layers 412A. Although only three layers of the conductive layers 412B and four layers of dielectric layers 412A are illustrated herein, however, the scope of the disclose is not limited by the embodiments of the disclosure. In other embodiments, the number of conductive layers 412B and the dielectric layers 412A may be adjusted based on product requirement. In some embodiments, the conductive layers 412B are electrically connected to the first conductive vias 116 of the first semiconductor chip SC1, and electrically connected to the second conductive vias 208 of the second semiconductor chip SC2. Furthermore, the conductive layers 412B are electrically connected to the through insulator vias 408. In some embodiments, the materials of the dielectric layer 412A and the conductive layer 412B of the redistribution layer 412 is similar to a material of the dielectric layer 406A and the conductive layer 406B mentioned for the redistribution layer 406. Therefore, the detailed description of the dielectric layer 412A and the conductive layer 412B will be omitted herein.

After forming the redistribution layer 412, a plurality of conductive pads 412C may be disposed on an exposed top surface of the topmost layer of the conductive layers 412B for electrically connecting with conductive balls. In certain embodiments, the conductive pads 412 are for example, under-ball metallurgy (UBM) patterns used for ball mount. As shown in FIG. 12E, the conductive pads 412C are formed on and electrically connected to the redistribution layer 412. In some embodiments, the materials of the conductive pads 412C may include copper, nickel, titanium, tungsten, or alloys thereof or the like, and may be formed by an electroplating process, for example. The number of conductive pads 412C are not limited in this disclosure, and may be selected based on the design layout. In some alternative embodiments, the conductive pads 412C may be omitted. In other words, conductive balls 414 formed in subsequent steps may be directly disposed on the redistribution layer 412.

After forming the conductive pads 412C, a plurality of conductive balls 414 is disposed on the conductive pads 412C and over the redistribution layer 412. In some embodiments, the conductive balls 414 may be disposed on the conductive pads 412C by a ball placement process or reflow process. In some embodiments, the conductive balls 414 are, for example, solder balls or ball grid array (BGA) balls. In some embodiments, the conductive balls 414 are connected to the redistribution layer 412 through the conductive pads 412C. In certain embodiments, some of the conductive balls 414 may be electrically connected to the chip structure CS1 through the redistribution layer 412. Furthermore, some of the conductive balls 414 may be electrically connected to the through insulator vias 408 through the redistribution layer 412. The number of the conductive balls 414 is not limited to the disclosure, and may be designated and selected based on the number of the conductive pads 412C. In addition, as illustrated in FIG. 12E, one or more passive components 416 may be mounted on the redistribution layer 412. For example, the passive components 416 may be mounted on the conductive layers 412B of the redistribution layer 412 through a soldering process. The disclosure is not limited thereto.

Figure 12F:
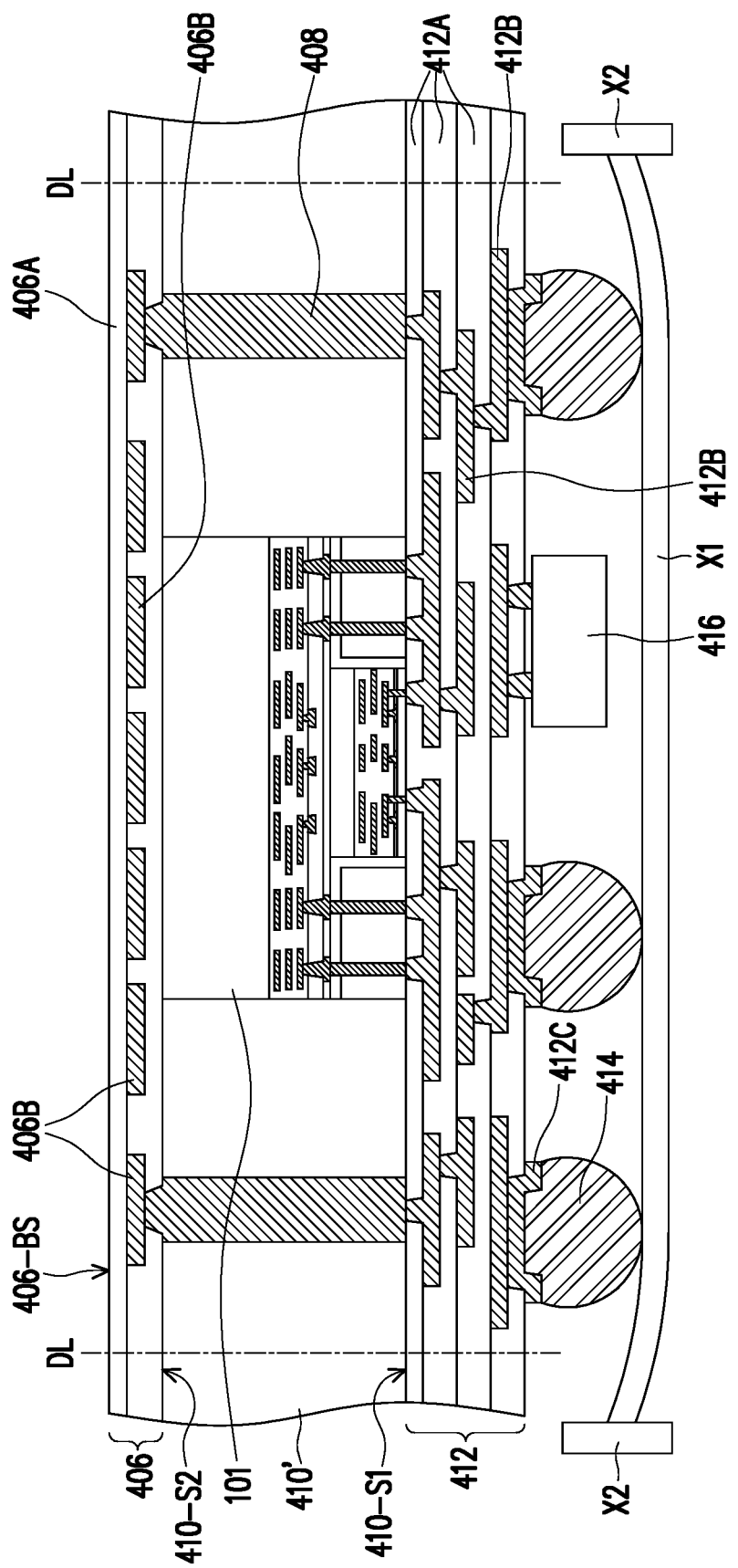

Referring to FIG. 12F, after forming the redistribution layer 412 and placing the conductive balls 414 and passive component 416 thereon, the structure shown in FIG. 12E may be turned upside down and attached to a tape X1 (e.g., a dicing tape) supported by a frame X2. As illustrated in FIG. 12F, the carrier 402 is debonded and is separated from the redistribution layer 406. In some embodiments, the de-bonding process includes projecting a light such as a laser light or an UV light on the debond layer 404 (e.g., the LTHC release layer) so that the carrier 402 can be easily removed along with the debond layer 404. During the de-bonding step, the tape X1 is used to secure the package structure before de-bonding the carrier 402 and the debond layer 404. After the de-bonding process, a backside surface 406-BS of the redistribution layer 406 is revealed or exposed. In certain embodiments, a dielectric layer 406A of the redistribution layer 406 is revealed or exposed.

Figure 12G:
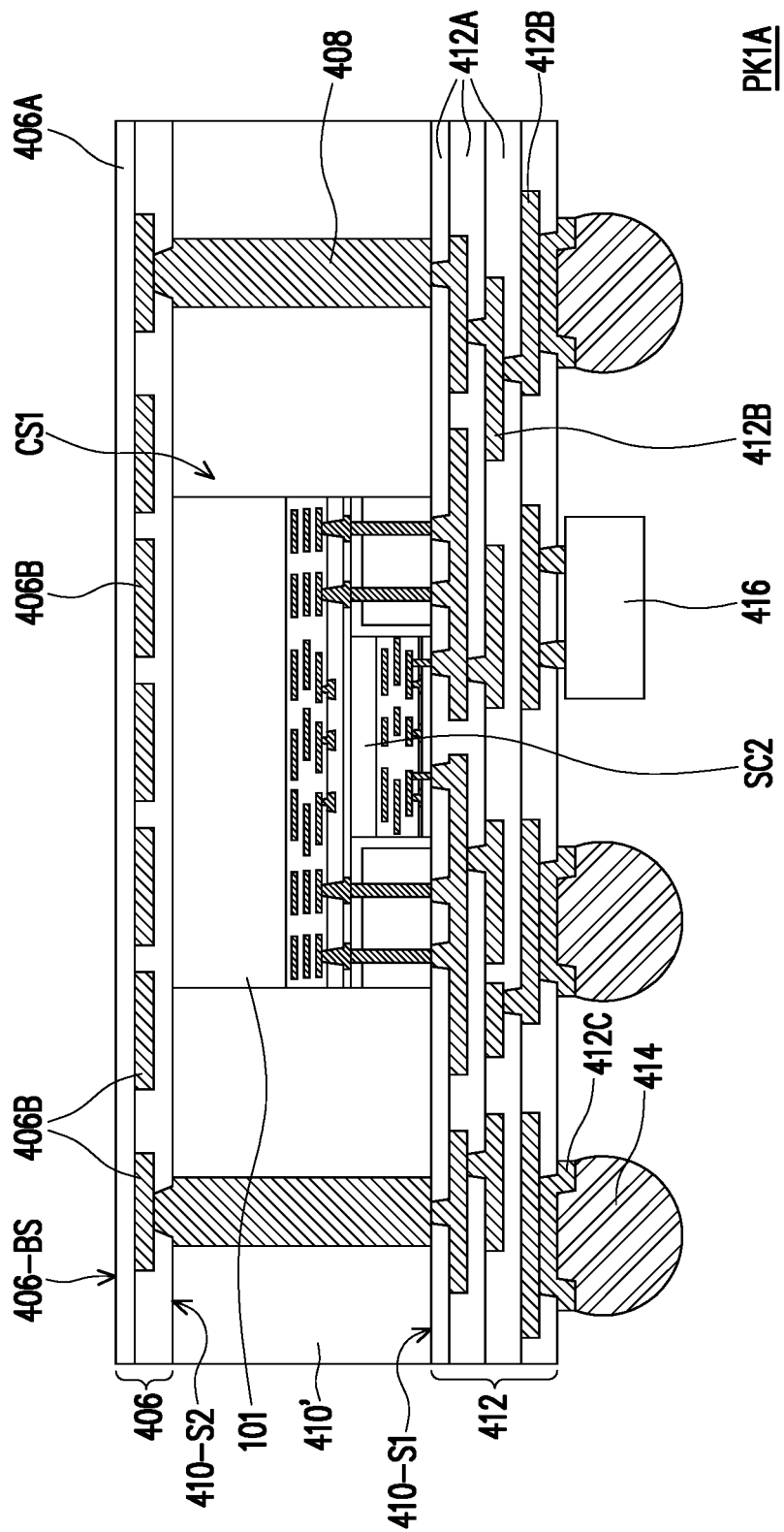

Referring to FIG. 12G, after the de-bonding process, a dicing process is performed along the dicing lines DL (shown in FIG. 12F) to cut the whole wafer structure (cutting through the insulating encapsulant 410', and the redistribution layers 406 and 412) into a plurality of package structures PK1A. In the exemplary embodiment, the dicing process is a wafer dicing process including mechanical blade sawing or laser cutting. In a subsequent process, the separated package structures PK1A may for example, be disposed onto a circuit substrate or onto other components based on requirements.

Figure 13:
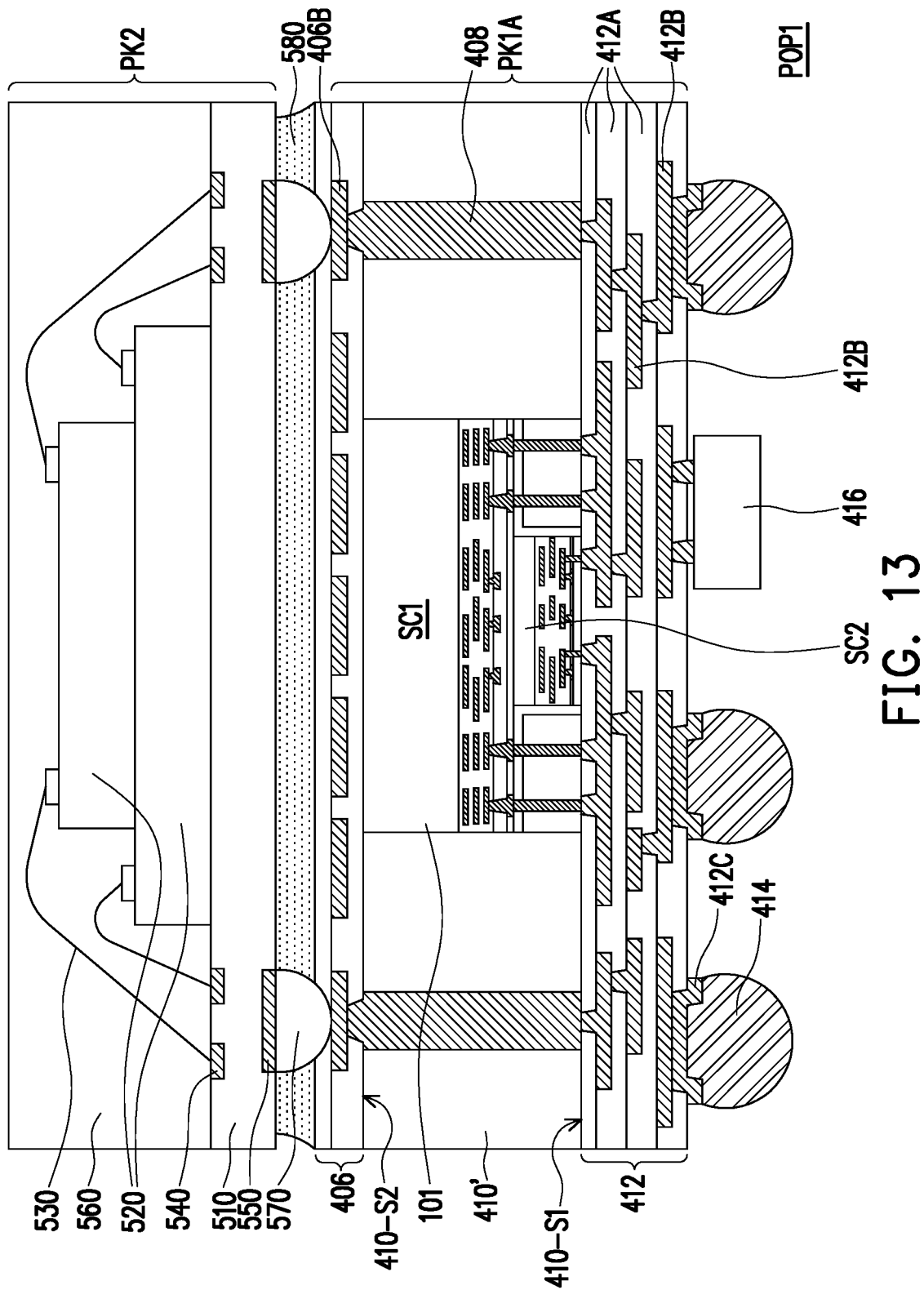
FIG. 13 is a schematic sectional view of a package-on-package (PoP) structure according to some exemplary embodiments of the present disclosure.

FIG. 13 is a schematic sectional view of a package-on-package (PoP) structure according to some exemplary embodiments of the present disclosure. Referring to FIG. 13, after fabricating a first package, such as the package structure PK1A illustrated in FIG. 12G, a second package PK2 may be stacked on the package structure PK1A (first package) so as to form a package-on-package (PoP) structure. As illustrated in FIG. 13, the second package PK2 is electrically connected to the conductive layer 406B of the package structure PK1A (first package). In some embodiments, the second package PK2 has a substrate 510, a plurality of semiconductor chips 520 mounted on one surface (e.g. top surface) of the substrate 510 and stacked on top of one another. In some embodiments, bonding wires 530 are used to provide electrical connections between the semiconductor chips 520 and pads 540 (such as bonding pads). In some embodiments, an insulating encapsulant 560 is formed to encapsulate the semiconductor chips 520 and the bonding wires 530 to protect these components. In some embodiments, through insulator vias (not shown) may be used to provide electrical connection between the pads 540 and conductive pads 550 (such as bonding pads) that are located on another surface (e.g. bottom surface) of the substrate 510. In certain embodiments, the conductive pads 550 are electrically connected to the semiconductor chips 520 through these through insulator vias (not shown). In some embodiments, the conductive pads 550 of the package structure PK2 are electrically connected to conductive balls 570. Furthermore, the conductive balls 570 are electrically connected to the conductive layer 406B of the redistribution layer 406 in the package structure PK1A (first package). In some embodiments, an underfill 580 is further provided to fill in the spaces between the conductive balls 570 to protect the conductive balls 570. After stacking the second package PK2 on the package structure PK1A (first package) and providing electrical connection therebetween, a package-on-package structure POP1 can be fabricated.

Figure 14:
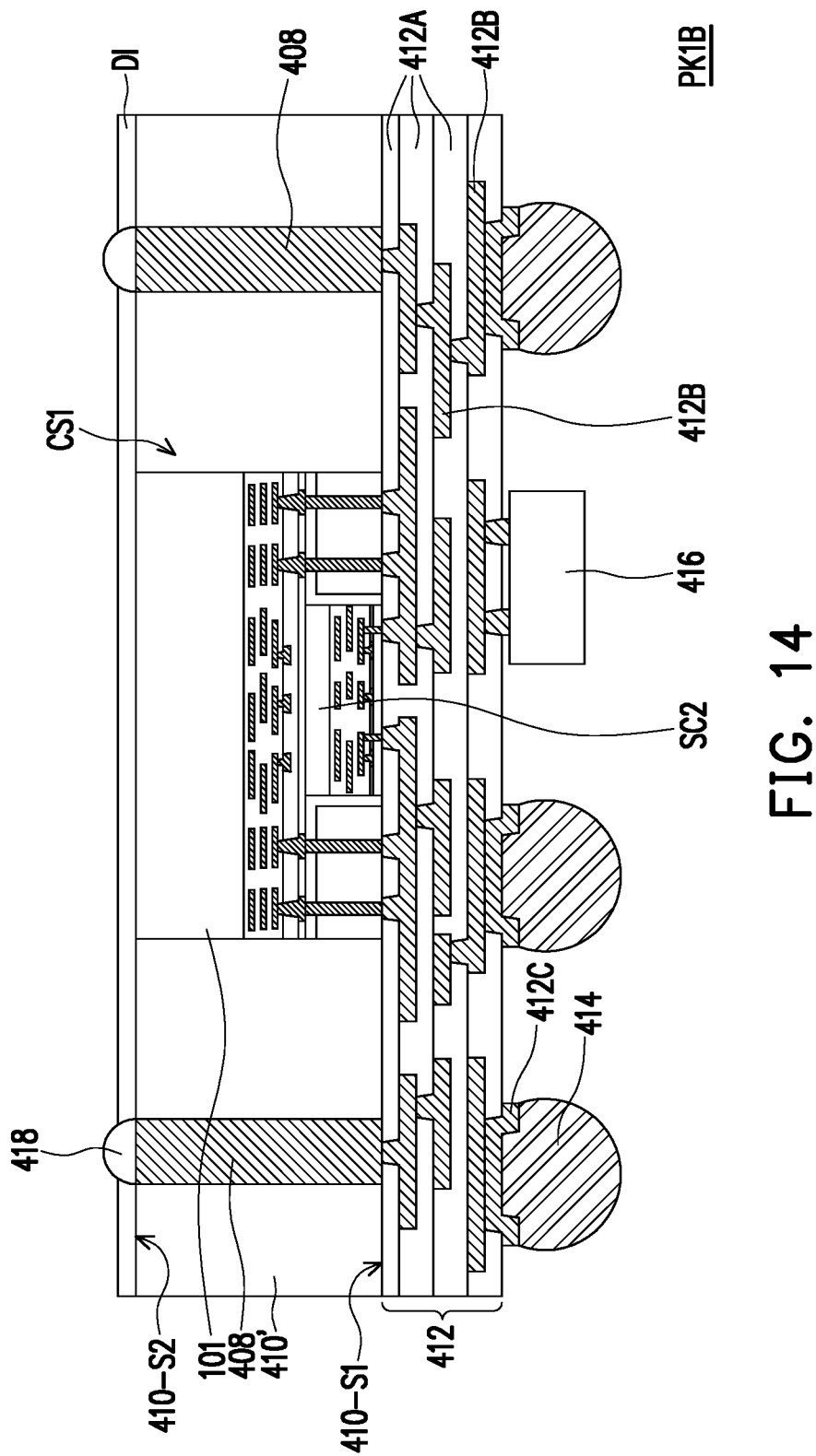
FIG. 14 is a schematic sectional view of a package structure according to some other exemplary embodiments of the present disclosure.

FIG. 14 is a schematic sectional view of a package structure according to some other exemplary embodiments of the present disclosure. The package structure PK1B illustrated in FIG. 14 is similar to the package structure PK1A illustrated in FIG. 12G, hence the same reference numerals are used to refer to the same or liked parts, and its detailed description will be omitted herein. The difference between the embodiments is that the redistribution layer 406 is omitted from the package structure PK1B. Referring to FIG. 14, in some embodiments, a dielectric layer DI is disposed on the second surface 410-S2 of the insulating encapsulant 410' in replacement of the redistribution layer 406. In certain embodiments, the dielectric layer DI has openings that reveal the through insulator vias 408, whereas conductive terminals 418 are further disposed in the openings of the dielectric layer DI and connected to the through insulator vias 408. In other words, a package structure PK1B with dual side terminals is accomplished without the redistribution layer 406. In alternative embodiments, the conductive terminals 418 may be omitted, and the dielectric layer DI may cover up the backside (second surface 410-S2) of the insulating encapsulant 410' and the backside of the chip structure CS1.

Figure 15:
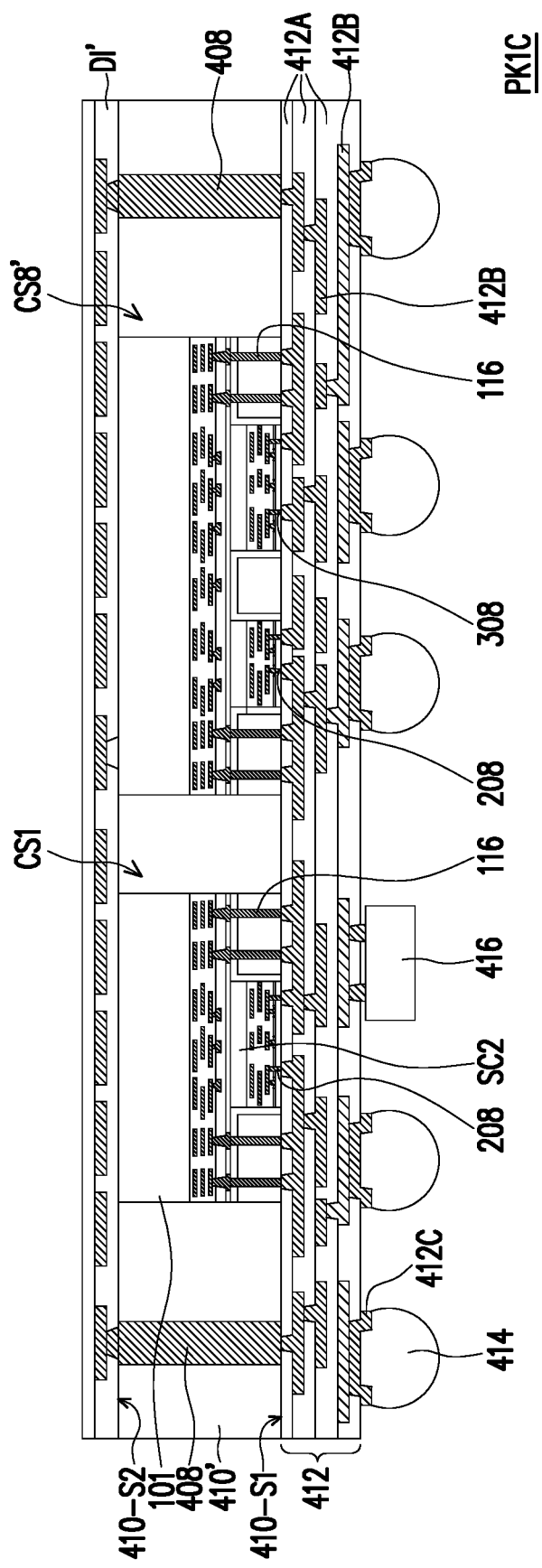
FIG. 15 is a schematic sectional view of a package structure according to some other exemplary embodiments of the present disclosure.

FIG. 15 is a schematic sectional view of a package structure according to some other exemplary embodiments of the present disclosure. The package structure PK1C illustrated in FIG. 15 is similar to the package structure PK1A illustrated in FIG. 12G, hence the same reference numerals are used to refer to the same or liked parts, and its detailed description will be omitted herein. The difference between the embodiments is that another chip structure CS8' is further included. As illustrated in FIG. 15, the chip structure CS8' is located aside the chip structure CS1, and being encapsulated by the insulating encapsulant 410'. The chip structure CS8' is for example, obtained by omitting the redistribution layer 118 and elements located thereon from the chip structure CS8 of FIG. 10. Furthermore, the redistribution layer 412 may be used in replacement of the redistribution layer 118 for providing electrical connection to the first conductive vias 116, the second conductive vias 208 and the third conductive vias 308 of the chip structure CS8'.

Figure 16:
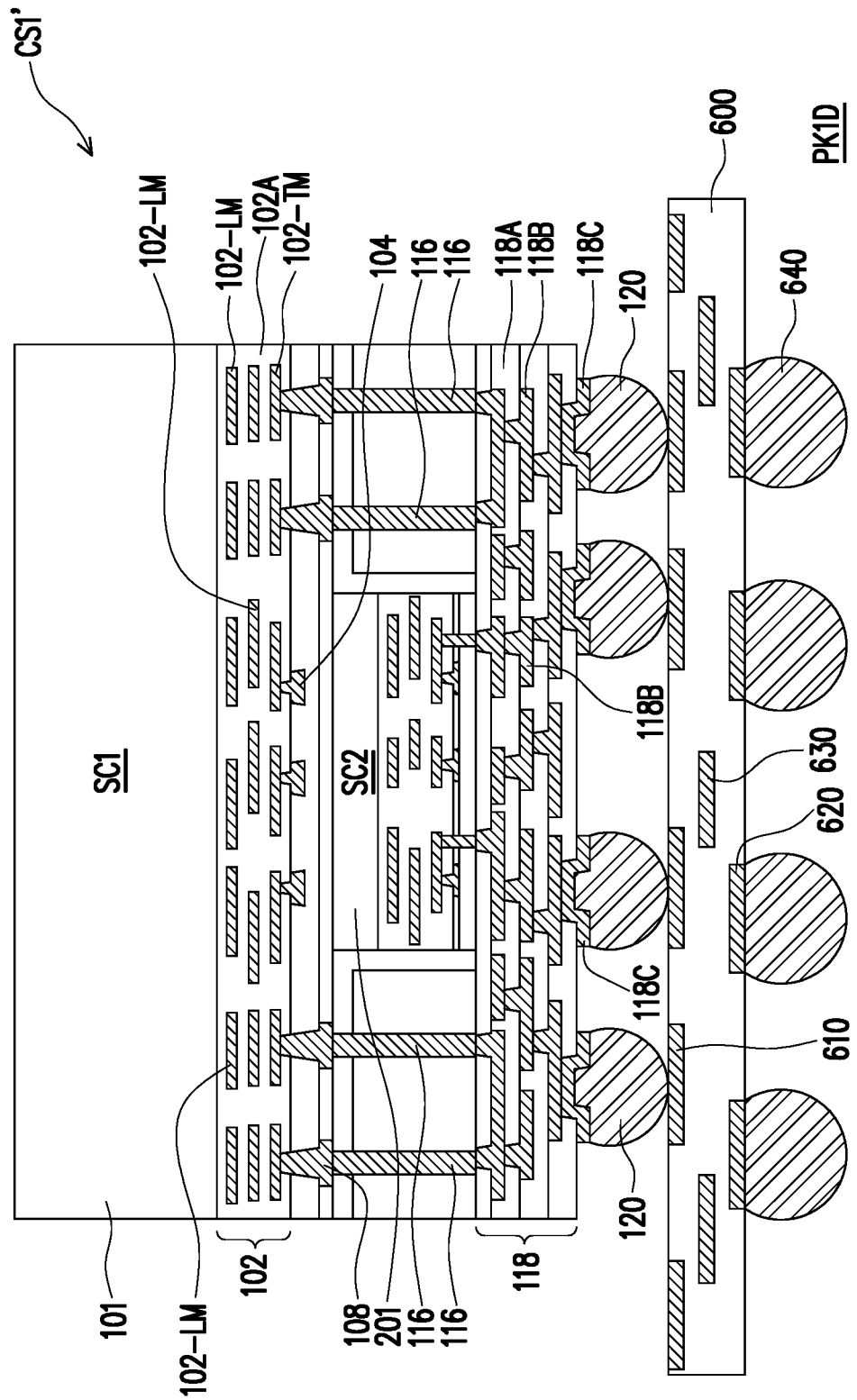
FIG. 16 is a schematic sectional view of a package structure according to some other exemplary embodiments of the present disclosure.

FIG. 16 is a schematic sectional view of a package structure according to some other exemplary embodiments of the present disclosure. The package structure PK1D is obtained by mounting the chip structure CS1' illustrated in FIG. 3 onto a substrate 600. Thus, the same reference numerals are used to refer to the same or liked parts, and its detailed description will not be repeated herein. Referring to FIG. 16, a substrate 600 is provided. In some embodiments, the substrate 600 includes contact pads 610, contact pads 620, metallization layers 630, and vias (not shown). In some embodiments, the contact pads 610 and the contact pads 620 are respectively distributed on two opposite sides of the substrate 600, and are exposed for electrically connecting with later-formed elements/features. In some embodiments, the metallization layers 630 and the vias are embedded in the substrate 600 and together provide routing function for the substrate 600, wherein the metallization layers 630 and the vias are electrically connected to the contact pads 610 and the contact pads 620. In other words, at least some of the contact pads 610 are electrically connected to some of the contact pads 620 through the metallization layers 630 and the vias. In some embodiments, the contact pads 610 and the contact pads 620 may include metal pads or metal alloy pads. In some embodiments, the materials of the metallization layers 630 and the vias may be substantially the same or similar to the material of the conductive layers 118B or conductive layers 406B, and thus its detailed description are not repeated herein for simplicity.

In some embodiments, as shown in FIG. 16, the chip structure CS1' depicted in FIG. 3 is bonded to the substrate 600 through physically connecting the conductive balls 120 and the contact pads 610 to form the package structure PK1D having a stacked structure, where the chip structure CS1' is physically and electrically connected to the substrate 600. The detail of the chip structure CS1' is described in FIG. 3, and thus are not repeated herein. In some embodiments, the substrate 600 is referred to as a circuit substrate, such as an organic flexible substrate or a printed circuit board. In such embodiments, the conductive balls 120 are, for example, chip connectors or BGA balls.

In some embodiments, a plurality of conductive terminals 640 are respectively formed on the substrate 600. As shown in FIG. 16, for example, the conductive terminals 640 are connected to the contact pads 620 of the substrate 600. In other words, the conductive terminals 640 are electrically connected to the substrate 600 through the contact pads 620. Through the contact pads 610 and the contact pads 620, some of the conductive terminals 640 are electrically connected to the chip structure CS1' (e.g. the semiconductor chips SC1/SC2 included therein). In some embodiments, the conductive terminals 640 are, for example, solder balls or BGA balls. In some embodiments, the chip structure CS1' is bonded to the substrate 600 through physically connecting the conductive balls 120 and the contact pads 610 of the substrate 600 by flip chip bonding.

Figure 17:
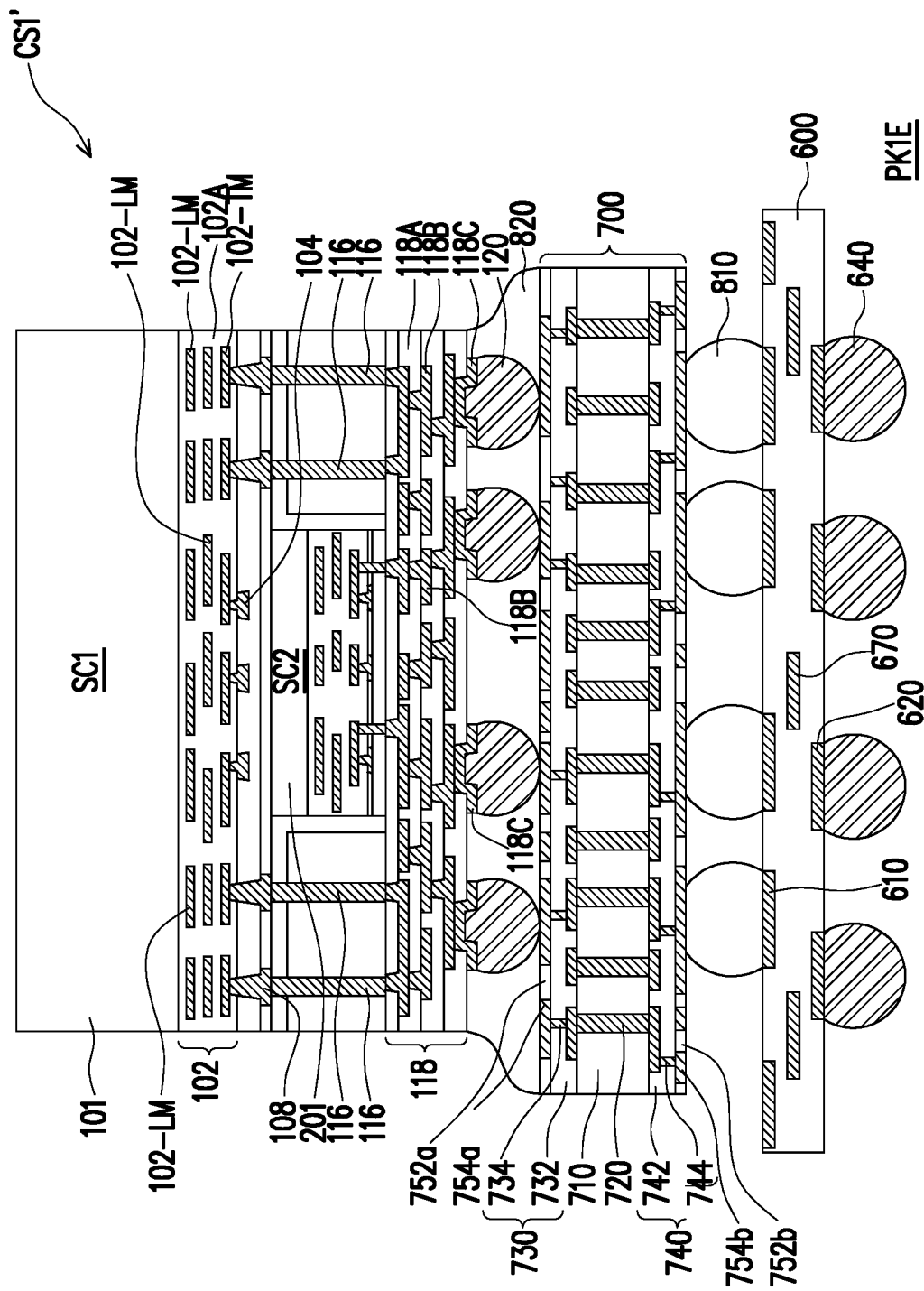
FIG. 17 is a schematic sectional view of a package structure according to some other exemplary embodiments of the present disclosure.

FIG. 17 is a schematic sectional view of a package structure according to some other exemplary embodiments of the present disclosure. The package structure PK1E is obtained by mounting the chip structure CS1' illustrated in FIG. 3 onto a circuit element 700 and a substrate 600. Thus, the same reference numerals are used to refer to the same or liked parts, and its detailed description will not be repeated herein. Referring to FIG. 17, in some embodiments, a circuit element 700 is provided. In some embodiments, the circuit element 700 includes a core portion 710, a plurality of vias 720, a redistribution circuit structure 730, a redistribution circuit structure 740, a plurality of bonding pads 754a, a plurality of bonding pads 754b, a solder mask layer 752a, and a solder mask layer 752b. In some embodiments, the core portion 710 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 720 is through silicon vias penetrating the core portions 710. In certain embodiments, the circuit element 700 is referred to as an interposer (see FIG. 17), in the disclosure.

In some embodiments, the redistribution circuit structure 730 and the redistribution circuit structure 740 are respectively disposed on two opposite sides of the core portion 710, as shown in FIG. 17. In some embodiments, the redistribution circuit structure 730 and/or the redistribution circuit structure 740 are electrically connected to the vias 720 penetrating the core portion 710. As shown in FIG. 17, the core portion 710 embedded with the vias 720 is located between the redistribution circuit structure 730 and the redistribution circuit structure 740. Through the vias 720, the redistribution circuit structure 730 and the redistribution circuit structure 740 are electrically connected to each other.

In some embodiments, the redistribution circuit structure 730 includes sequentially forming one or more dielectric layers 732 and one or more metallization layers 734 in alternation, where one metallization layer 734 is sandwiched between two dielectric layers 732. As shown in FIG. 17, portions of a top surface of a topmost layer of the metallization layers 734 are respectively exposed by openings formed in a topmost layer of the dielectric layers 732 for connecting with other conductive features, and portions of a bottom surface of a bottommost layer of the metallization layers 734 are respectively exposed by openings formed in a bottommost layer of the dielectric layers 732 for connecting with the vias 720. The numbers of the metallization layers and the dielectric layers included in the redistribution circuit structure 730 are not limited thereto, and may be designated and selected based on the demand.

In some embodiments, the redistribution circuit structure 740 includes sequentially forming one or more dielectric layers 742 and one or more metallization layers 744 in alternation, where one metallization layer 744 is sandwiched between two dielectric layers 742. As shown in FIG. 17, portions of a top surface of a topmost layer of the metallization layers 744 are respectively exposed by openings formed in a topmost layer of the dielectric layers 742 for connecting with the vias 720, and portions of a bottom surface of a bottommost layer of the metallization layers 744 are respectively exposed by openings formed in a bottommost layer of the dielectric layers 742 for connecting with other conductive features. The numbers of the metallization layers and the dielectric layers included in the redistribution circuit structure 740 are not limited thereto, and may be designated and selected based on the demand.

In certain embodiments, the materials of the dielectric layers 732 and the dielectric layers 742 may be polyimide, PBO, BCB, a nitride such as silicon nitride, an oxide such as silicon oxide, PSG, BSG, BPSG, a combination thereof or the like, which may be patterned using a photolithography and/or etching process. In some embodiments, the dielectric layers 732 and the dielectric layers 742 formed by suitable fabrication techniques such as spin-on coating, CVD, PECVD, or the like. The disclosure is not limited thereto. In one embodiment, the materials of the dielectric layers 732 and the dielectric layers 7242 may be the same. In an alternative embodiment, the materials of the dielectric layers 732 and the dielectric layers 742 may be different.

In certain embodiments, the material of the metallization layers 734 and the metallization layers 744 may be made of conductive materials formed by electroplating or deposition, such as aluminum, titanium, copper, nickel, tungsten, and/or alloys thereof, which may be patterned using a photolithography and etching process. In some embodiments, the metallization layers 734 and the metallization layers 744 may be patterned copper layers or other suitable patterned metal layers. In one embodiment, the materials of the metallization layers 734 and the metallization layers 744 may be the same. In an alternative embodiment, the materials of the metallization layers 734 and the metallization layers 744 may be different.

In some embodiments, the bonding pads 754a are disposed on a surface of the redistribution circuit structure 730 and physically connected to the portions of the top surface of the topmost layer of the metallization layers 734 exposed by the openings formed in the topmost layer of the dielectric layers 732, where the bonding pads 754a are physically separated from each other through the solder mask layer 752a formed on the surface of the redistribution circuit structure 730 with the bonding pads 754a disposed thereon. Through the redistribution circuit structure 730, the bonding pads 754a are electrically connected to the vias 720 embedded in the core portion 710.

In some embodiments, the bonding pads 754b are disposed on a surface of the redistribution circuit structure 740 and physically connected to the portions of the bottom surface of the bottommost layer of the metallization layers 744 exposed by the openings formed in the bottommost layer of the dielectric layers 742, where the bonding pads 754b are physically separated from each other through the solder mask layer 752b formed on the surface of the redistribution circuit structure 740 with the bonding pads 754b disposed thereon. Through the redistribution circuit structure 740, the bonding pads 754b are electrically connected to the vias 720 embedded in the core portion 710.

As illustrated in FIG. 17, in some embodiments, the bonding pads 754a are electrically connected to the redistribution circuit structure 730 and the bonding pads 754b are electrically connected to the redistribution circuit structure 740. In some embodiments, the bonding pads 754a and the bonding pads 754b may include under bump metallurgies (UBMs), however the disclosure is not limited thereto. As shown in FIG. 17, the bonding pads 754a and the bonding pads 754b are electrically connected to each other though the vias 720, the redistribution circuit structure 730, and redistribution circuit structure 740, for example.

In an alternative embodiment, one or both of the redistribution circuit structure 730 and the redistribution circuit structure 740 may be omitted from the circuit element 700, the disclosure is not limited thereto. That is, for example, the circuit element 700 may include a core portion 710, a plurality of vias 720, a plurality of bonding pads 752a, a plurality of bonding pads 754b, a solder mask layer 752a, and a solder mask layer 752b, where the bonding pads 754a and the bonding pads 754b are electrically connected to each other though the vias 720.

In some embodiments, a plurality of conductive terminals 810 are respectively formed on the bonding pads 754b. As shown in FIG. 17, for example, the conductive terminals 810 are physically connected to the bonding pads 754b. In other words, the conductive terminals 810 are electrically connected to the circuit element 700 through the bonding pads 754b. Through the bonding pads 754b, some of the conductive terminals 810 are electrically connected to some of the bonding pads 754a. In some embodiments, the conductive terminals 810 are, for example, chip connectors or BGA balls.

Referring still to FIG. 17, in some embodiments, the chip structure CS1' depicted in FIG. 3 is provided and bonded to the circuit element 700, and the circuit element 700 is bonded to the substrate 600 to form the package structure PK1E having a stacked structure. The detail of the chip structure CS1' is described in FIG. 3, and the detail of the substrate 600 is described in FIG. 16, and thus their descriptions are not repeated herein. In some embodiments, the chip structure CS1' is physically connected to the circuit element 700 through connecting the conductive balls 120 and the bonding pads 754a of the circuit element 700, and the circuit element 700 is physically connected to the substrate 600 through connecting the conductive terminals 810 and the contact pads 610 of the substrate 600. In other words, the chip structure CS1' is electrically connected to the circuit element 700 through the conductive balls 120 and the bonding pads 754a, the circuit element 700 is electrically connected to the substrate 600 through the conductive terminals 810 and the contact pads 610, so that the chip structure CS1' is electrically connected to the substrate 600 through the conductive terminals 120, the bonding pads 754a, the conductive terminals 810 and the contact pads 610. In such embodiments, the conductive balls 120 are, for example, micro-bumps while the conductive terminals 810 are chip connectors and the conductive terminals 640 are solder balls or BGA balls. In certain embodiments, the package structure PK1E depicted in FIG. 17 may be formed by chip on wafer on substrate (CoWoS) packaging processes.

In the above-mentioned embodiments, a chip structure includes at least one second semiconductor chip embedded within the first semiconductor die, wherein the second semiconductor chip is surrounded by the first conductive vias. Furthermore, a redistribution layer may be used for electrically connecting the first conductive vias of the first semiconductor chip to the second conductive vias of the second semiconductor chip. By using such an integrated chip structure, the communication path between the semiconductor chips may be shortened (fine pitch between die connection), and better signal/power transmission may be achieved. Due to multi-chip stacking, the distances between the conductive vias of the chips are shortened, thus the redistribution layer used for electrically connecting the chips together will also have a fine pitch. Furthermore, the chip structure may be integrated in different package types or modules, such as CoWos, flip chip, InFO/fan-out WLP (wafer level packaging). Overall, the design of the chip size is more flexible, the desired thickness and chip function integration may be readily achieved, and the performance and efficiency of the package structure may be improved.

In accordance with some embodiments of the present disclosure, a chip structure including a first semiconductor chip, a second semiconductor chip and a redistribution layer is provided. The first semiconductor chip includes a first semiconductor substrate, a first interconnection layer located on the first semiconductor substrate, a first protection layer covering the first interconnection layer, a gap fill layer located on the first protection layer, and a plurality of first conductive vias embedded in the gap fill layer and electrically connected with the first interconnection layer. The second semiconductor chip is embedded within the first semiconductor chip and surrounded by the gap fill layer and the plurality of first conductive vias, wherein the second semiconductor chip includes a second semiconductor substrate, a second interconnection layer located on the second semiconductor substrate, a second protection layer located on the second interconnection layer, and a plurality of second conductive vias embedded in the second protection layer and electrically connected with the second interconnection layer, wherein the second semiconductor substrate is bonded to the first protection layer. The redistribution layer is located over the gap fill layer of the first semiconductor chip, wherein the redistribution layer is electrically connected to the plurality of first conductive vias and the plurality of second conductive vias.

In accordance with some other embodiments of the present disclosure, a package structure including at least one integrated chip structure, an insulating encapsulant, a plurality of through insulator vias, and a redistribution layer is provided. The integrated chip structure includes a first semiconductor chip and a second semiconductor chip. The first semiconductor chip includes a first semiconductor substrate, a first interconnection layer located on the first semiconductor substrate, a first protection layer covering the first interconnection layer, a gap fill layer located on the first protection layer, and a plurality of first conductive vias embedded in the gap fill layer and electrically connected with the first interconnection layer. The second semiconductor chip is embedded within the first semiconductor chip and surrounded by the gap fill layer and the plurality of first conductive vias, wherein the second semiconductor chip comprises a second semiconductor substrate, a second interconnection layer located on the second semiconductor substrate, a second protection layer located on the second interconnection layer, and a plurality of second conductive vias embedded in the second protection layer and electrically connected with the second interconnection layer, wherein the second semiconductor substrate is bonded to the first protection layer. The insulating encapsulant has a first surface and a second surface opposite to the first surface, wherein the insulating encapsulant is encapsulating the at least one integrated chip structure. The plurality of through insulator vias is embedded within the insulating encapsulant and surrounding the at least one integrated chip structure. The redistribution layer is located over the first surface of the insulating encapsulant and electrically connected to the plurality of first conductive vias, the plurality of second conductive vias and the plurality of through insulator vias.

In yet another embodiment of the present disclosure, a method of fabricating a chip structure is described. The method includes the following steps. A semiconductor wafer having a plurality of first semiconductor chips is provided, wherein each of the first semiconductor chips comprises a first semiconductor substrate, a first interconnection layer located on the first semiconductor substrate, and a first protection layer covering the first interconnection layer. At least one second semiconductor chip is disposed on the first protection layer of each of the first semiconductor chips, wherein the at least one second semiconductor chip comprises a second semiconductor substrate, a second interconnection layer located on the second semiconductor substrate, a second protection layer located on the second interconnection layer, and a plurality of second conductive vias embedded in the second protection layer and electrically connected with the second interconnection layer. A gap fill layer is formed over first protection layer and covering the at least one second semiconductor chip. A planarization process is performed by removing portions of the second protection layer and portions of the gap fill layer to reveal the plurality of second conductive vias. The gap fill layer is etched, and a plurality of first conductive vias is formed in the gap fill layer. The semiconductor wafer is diced to separate the plurality of first semiconductor chips to form the chip structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a first chip comprising a first substrate, a first interconnection layer directly disposed on the first substrate, a gap fill layer disposed on the first substrate, and first conductive vias embedded in the gap fill layer and electrically connected to the first interconnection layer, wherein sidewalls of the gap fill layer is aligned with sidewalls of the first substrate and aligned with sidewalls of the first interconnection layer;
a second chip embedded in the gap fill layer and surrounded by first conductive vias, wherein the second chip comprises a second substrate and second conductive vias located on the second substrate;

an insulating encapsulant laterally surrounding the first chip and physically separated from the second chip by the gap fill layer;
through insulator vias embedded in the insulating encapsulant and surrounding the first chip and the second chip; and
a redistribution layer disposed on the insulating encapsulant and electrically connected to the first conductive vias, the second conductive vias and the through insulator vias.

2. The structure according to claim 1, further comprising a second redistribution layer disposed on the insulating encapsulant and electrically connected to the through insulator vias.

3. The structure according to claim 1, further comprising a third chip embedded in the gap fill layer and surrounded by first conductive vias, wherein the third chip comprises a third substrate and third conductive vias located on the third substrate, and wherein the redistribution layer is electrically connected to the third conductive vias.

4. The structure according to claim 1, wherein the second chip is disposed on the first interconnection layer and further comprises a second interconnection layer disposed on the second substrate, and the second conductive vias are electrically connected to the second interconnection layer.

5. The structure according to claim 4, wherein the second chip further comprises dummy pads disposed on and connected to the second interconnection layer, and a height of the second conductive vias is greater than a height of the dummy pads.

6. The structure according to claim 4, further comprising a etch stop layer disposed on the first interconnection layer and covering sidewalls of the second substrate and sidewalls of the second interconnection layer.

7. The structure according to claim 1, further comprising a plurality of conductive balls and a passive component disposed on and electrically connected to the redistribution layer.

8. A structure, comprising:
a first package, comprising:
a first redistribution layer and a second redistribution layer;
an insulating encapsulant disposed in between the first redistribution layer and the second redistribution layer;
an integrated chip structure embedded in the insulating encapsulant in between the first redistribution layer and the second redistribution layer, wherein the integrated chip structure comprises;
a first substrate;
first conductive posts disposed on the first substrate;
an inter-dielectric layer, a dielectric layer and a first protection layer sequentially disposed on the first substrate and laterally surrounding and physically contacting the first conductive posts, wherein all the inter-dielectric layer, the dielectric layer and the first protection layer have planar top surfaces and planar bottom surfaces;
first conductive vias disposed on and physically and electrically connected to the first conductive posts, and further electrically connected to the first redistribution layer;
a second substrate disposed on the first protection layer within an area surrounded by the first conductive vias, and in physical contact with the first protection layer;
second conductive vias disposed on the second substrate and electrically connected to the first redistribution layer; and
a gap fill layer laterally surrounding the first conductive posts, the second substrate and the second conductive vias;
a second package disposed on the first package, wherein the second package is electrically connected to the second redistribution layer through a plurality of conductive balls.

9. The semiconductor package according to claim 8, further comprising an underfill located in between the first package and the second package and covering the plurality of conductive balls.

10. The semiconductor package according to claim 8, further comprising through insulator vias electrically connecting the first redistribution layer to the second redistribution layer.

11. The semiconductor package according to claim 8, wherein the integrated chip structure further comprises an etch stop layer disposed on the first protection layer and covering sidewalls of the second substrate, and wherein the gap fill layer is disposed on and in contact with the etch stop layer.

12. The semiconductor package according to claim 8, wherein the integrated chip structure further comprises a second protection layer laterally surrounding the second conductive vias, and a top surface of the second protection layer is levelled with a top surface of the gap fill layer.

13. The semiconductor package according to claim 12, wherein a top surface of the first conductive vias and a top surface of the second conductive vias are levelled with the top surface of the second protection layer and the top surface of the gap fill layer.

14. The semiconductor package according to claim 8, wherein the second package comprises a semiconductor substrate, a plurality of semiconductor chips disposed on the semiconductor substrate, and an encapsulant layer laterally surrounding the plurality of semiconductor chips.

15. A structure, comprising:
a first package, the first package comprises:
a first chip comprising a first substrate, a plurality of conductive posts disposed on the first substrate, an etch stop layer disposed on the first substrate and physically contacting and partially covering top surfaces of the plurality of conductive posts, and a plurality of first conducive vias disposed on the first substrate and penetrating through the etch stop layer and electrically connected to the plurality of conductive posts;
a second chip embedded in the first chip, wherein a width of the second chip is smaller than a width of the first chip, sidewalls of the second chip are covered up by the etch stop layer, and the second chip comprises an interconnection layer, dummy pads disposed on and directly connected to a topmost metallization layer of the interconnection layer, a plurality of second conductive vias disposed on and directly connected to the topmost metallization layer of the interconnection layer, and a protection layer covering a top surface of the dummy pads and laterally surrounding the plurality of second conductive vias, and wherein a top surface of the plurality of second conductive vias is levelled with a top surface of the plurality of first conductive vias and a top surface of the protection layer;

through vias surrounding the first chip and the second chip; and an insulating encapsulant encapsulating the first chip and the through vias, wherein the insulating encapsulant is physically separated from the second chip.

16. The structure according to claim 15, further comprising a top redistribution layer and a backside redistribution layer disposed on two opposing sides of the insulating encapsulant, wherein the top redistribution layer is electrically connected to the first chip and the second chip.

17. The structure according to claim 16, further comprising a second package disposed on the first package, wherein the second package is electrically connected to the backside redistribution layer of the first package through a plurality of conductive balls.

18. The structure according to claim 15, wherein the first chip further comprises a gap fill layer disposed on the etch stop layer and laterally surrounding the second chip.

19. The structure according to claim 15, wherein the first chip further comprises a first interconnection layer disposed on the first substrate, and the plurality of first conductive vias and the plurality of conductive posts are electrically connected to the first interconnection layer, and sidewalls of the first interconnection layer are aligned with sidewalls of the first substrate and sidewalls of the etch stop layer.

20. The structure according to claim 19, further comprising a dielectric layer and a first protection layer located in between the etch stop layer and the first interconnection layer, wherein the dielectric layer is in contact with the first interconnection layer, and the first protection layer is in contact with the second chip.

* * * * *